(12) United States Patent
Lee

(10) Patent No.: US 10,020,253 B2
(45) Date of Patent: Jul. 10, 2018

(54) MANUFACTURING METHOD OF MEMORY DEVICE

(71) Applicant: Winbond Electronics Corp., Taichung (TW)

(72) Inventor: Shu-Mei Lee, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/359,583

(22) Filed: Nov. 22, 2016

(65) Prior Publication Data

US 2018/0108608 A1 Apr. 19, 2018

(30) Foreign Application Priority Data

Oct. 17, 2016 (CN) .......................... 2016 1 0903212

(51) Int. Cl.
| | | |
|---|---|---|
| *H01L 21/70* | (2006.01) | |
| *H01L 23/522* | (2006.01) | |
| *H01L 23/528* | (2006.01) | |
| *H01L 23/04* | (2006.01) | |
| *H01L 21/768* | (2006.01) | |
| *H01L 21/762* | (2006.01) | |

(52) U.S. Cl.
CPC .... *H01L 23/5226* (2013.01); *H01L 21/76224* (2013.01); *H01L 21/76802* (2013.01); *H01L 21/76877* (2013.01); *H01L 21/76895* (2013.01); *H01L 23/04* (2013.01); *H01L 23/528* (2013.01)

(58) Field of Classification Search
CPC ........... H01L 23/5226; H01L 21/76224; H01L 21/76895; H01L 21/76877; H01L 23/04; H01L 23/528; H01L 21/76802
See application file for complete search history.

(56) References Cited

U.S. PATENT DOCUMENTS

2015/0076669 A1* 3/2015 Chang ............... H01L 21/76804
257/635
2016/0043171 A1* 2/2016 Jang .................... H01L 29/0653
257/330

FOREIGN PATENT DOCUMENTS

| TW | 201106445 | 2/2011 |
| TW | 201230303 | 7/2012 |

OTHER PUBLICATIONS

"Office Action of Taiwan Counterpart Application", dated Mar. 8, 2017, p. 1-p. 3.

* cited by examiner

*Primary Examiner* — Anthony Ho
*Assistant Examiner* — Mohammad M Hoque
(74) *Attorney, Agent, or Firm* — JCIPRNET

(57) ABSTRACT

The invention provides a memory device. The memory device includes a substrate, a plurality of first wires, a plurality of etch-stop layers, a dielectric layer, and a plurality of vias. The substrate has a plurality of first regions and a plurality of second regions arranged in a staggered manner along a first direction. The first wires are embedded in the substrate and extended along the first direction. The first wires include a conductive layer and a cap layer located on the conductive layer, and the upper surface of the cap layer has a groove. The etch-stop layers are located on the cap layer and filled in the groove. The dielectric layer is located on the substrate and has a plurality of via openings in the first regions. The via openings expose the substrate and the etch-stop layer. The vias are filled in the via openings and electrically connected to the substrate. The invention further provides a manufacturing method of a memory device.

4 Claims, 44 Drawing Sheets

MANUFACTURING METHOD OF MEMORY DEVICE

CROSS-REFERENCE TO RELATED APPLICATION

This application claims the priority benefit of China application serial no. 201610903212.X, filed on Oct. 17, 2016. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and more particularly, to a memory device and a manufacturing method thereof Description of Related Art In a memory device, to achieve the objects of increasing the channel length of the transistor, sufficiently utilizing substrate space, and increasing the distance between the wires in different layers, embedded wires are often formed in the substrate. To protect the embedded wires from being affected in a subsequent process, a cap layer is generally disposed above the embedded wires to protect the embedded wires. However, voids often appear in the cap layer, and therefore the protective function of the cap layer is significantly reduced.

SUMMARY OF THE INVENTION

The invention provides a memory device increasing the protection of embedded wires.

The memory device of the invention includes a substrate, a plurality of first wires, an etch-stop layer, a dielectric layer, and a plurality of vias. The substrate has a plurality of first regions and a plurality of second regions, and the first regions and the second regions are arranged in a staggered manner along a first direction. The first wires are embedded in the substrate and extended along the first direction. The first wires include a conductive layer and a cap layer located on the conductive layer, and the upper surface of the cap layer has a groove. The etch-stop layer is located on the substrate and the cap layer and filled in the groove. The dielectric layer is located on the substrate and has a plurality of via openings in the first regions. The via openings expose the substrate and the etch-stop layer. The vias are filled in the via openings and cover the top corner of the groove and are electrically connected to the substrate.

The memory device of the invention includes a plurality of first wires, a dielectric layer, an etch-stop layer, and a plurality of vias. The first wires act as a plurality of word lines respectively extended along the first direction and embedded in the substrate, and the first wires include a conductive layer and a cap layer located on the conductive layer. The dielectric layer is located on the substrate. The etch-stop layer is located between the cap layer and the dielectric layer and between the dielectric layer and the substrate. The vias pass through the dielectric layer and the etch-stop layer. The vias are electrically connected to the upper surface of the substrate and the sidewall of the substrate exposed by the cap layer. Moreover, the etch-stop layer is in contact with the lower sidewall of the vias.

The manufacturing method of the memory device of the invention includes: providing a substrate having a plurality of first regions and a plurality of second regions, wherein the first regions and the second regions are arranged in a staggered manner along a first direction. A plurality of first wires extended along the first direction is formed in the substrate. The first wires include a conductive layer and a cap layer located on the conductive layer. A portion of the cap layer is removed to form a groove on the upper surface of the cap layer. An etch-stop layer is formed, and the etch-stop layer at least covers the cap layer and is filled in the groove. A dielectric layer is formed, and the dielectric layer in the first regions covers the first wires and the substrate. A plurality of openings is formed in the dielectric layer in the first regions, and the openings expose the upper surface of the etch-stop layer. The openings are etched to form a plurality of via openings, and the via openings expose the upper surface of the substrate and the groove. A plurality of vias is formed, and the vias are filled in the via openings and electrically connected to the substrate.

In some embodiments of the invention, a first etch-stop layer is formed on the cap layer of the first wires, wherein the material of the first etch-stop layer is different from the material of the cap layer. Therefore, an etch selectivity exists between the first etch-stop layer and the cap layer, and the cap layer and the conductive layer below can be protected when the via openings are formed.

In some embodiments of the invention, a protective layer covering the bottom and the sidewall of the openings is formed in the openings. By disposing the protective layer, the dielectric layer, the cap layer, and the conductive layer can further be protected when the via openings are formed, and therefore process margin is increased.

BRIEF DESCRIPTION OF THE DRAWINGS

FIG. 1A to FIG. 13A are cross-sectional schematic diagrams of line A-A' in FIG. 1D to FIG. 13D.

FIG. 1B to FIG. 13B are cross-sectional schematic diagrams of line B-B' in FIG. 1D to FIG. 13D.

FIG. 1C to FIG. 13C are cross-sectional schematic diagrams of line C-C' in FIG. 1D to FIG. 13D.

FIG. 1D to FIG. 13D are top views of various stages of the manufacturing process of a memory device according to some embodiments of the disclosure.

DESCRIPTION OF THE EMBODIMENTS

Figure 1A:
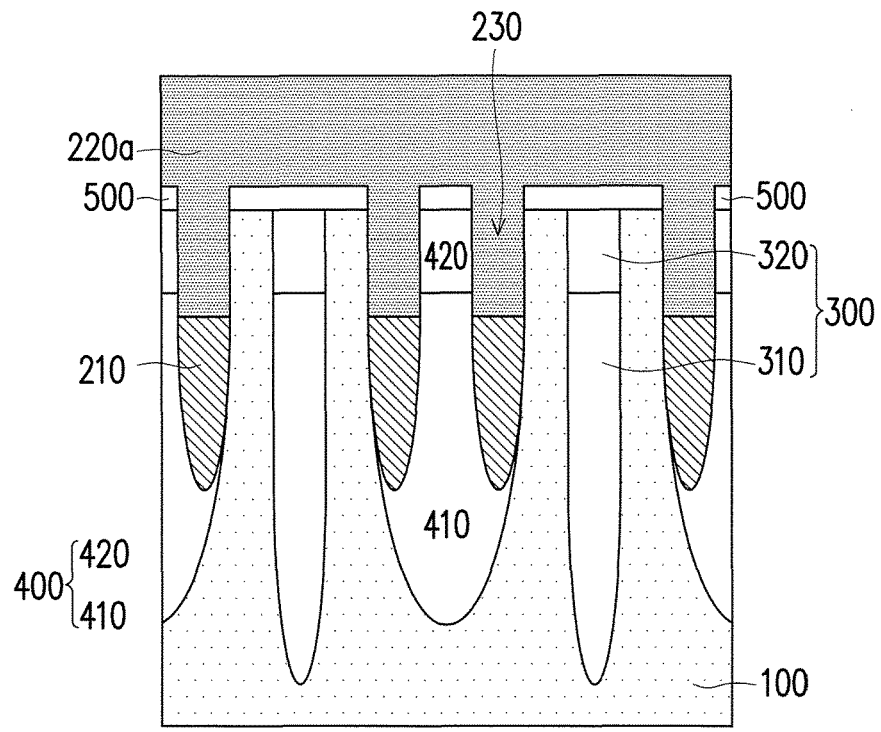
Figure 1B:
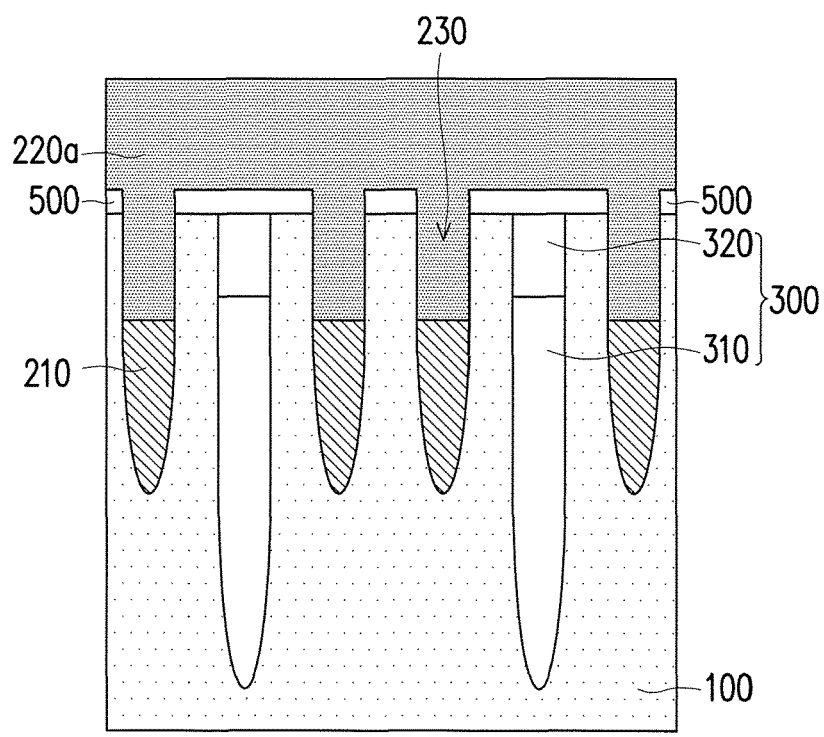
Figure 1C:
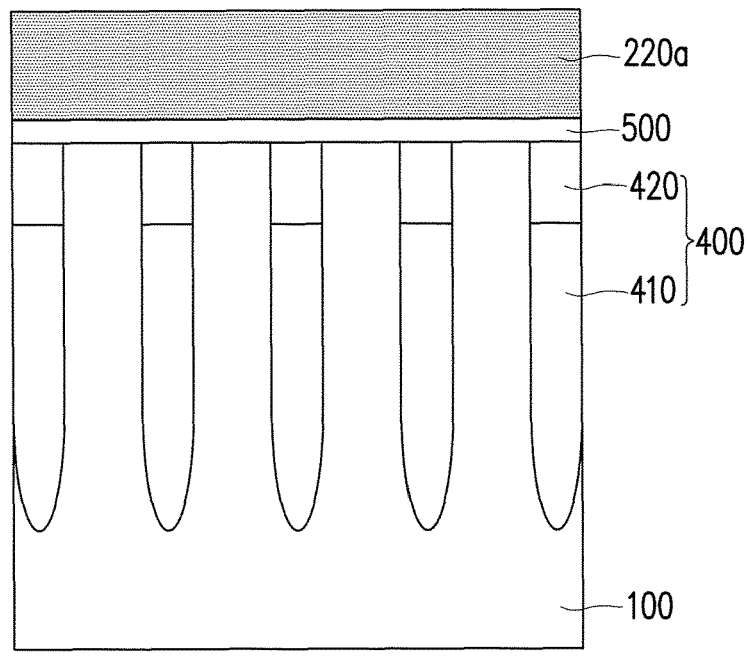
Figure 1D:
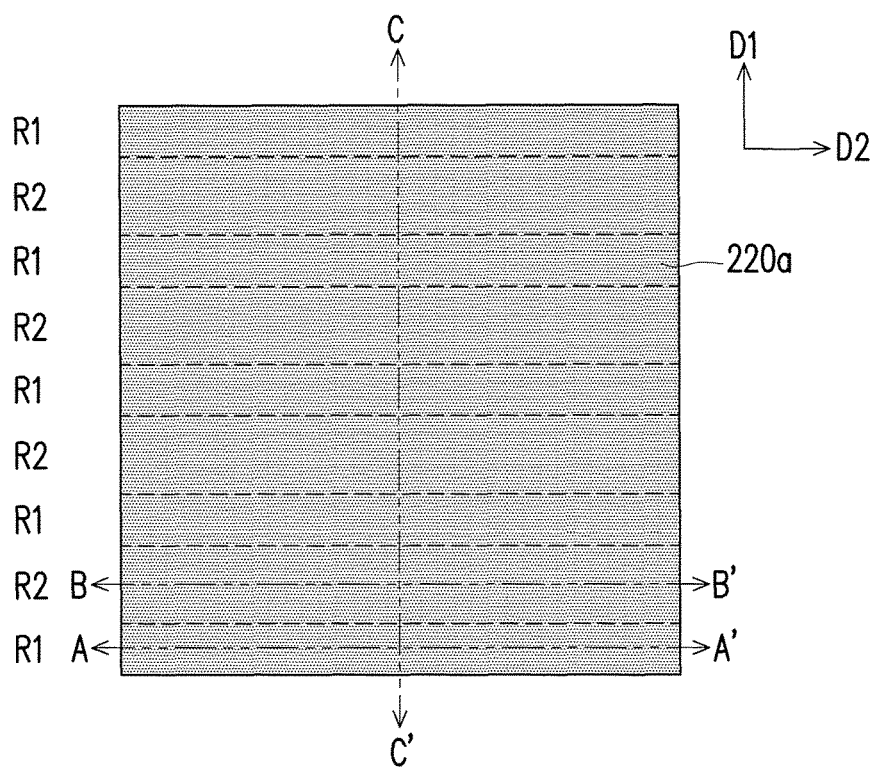
Figure 2A:
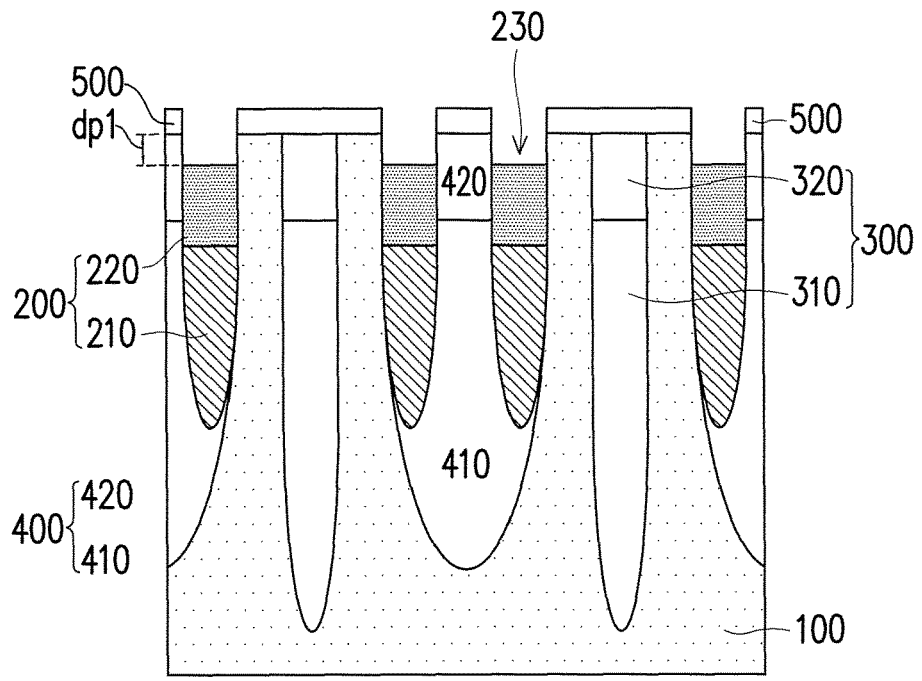
Figure 2B:
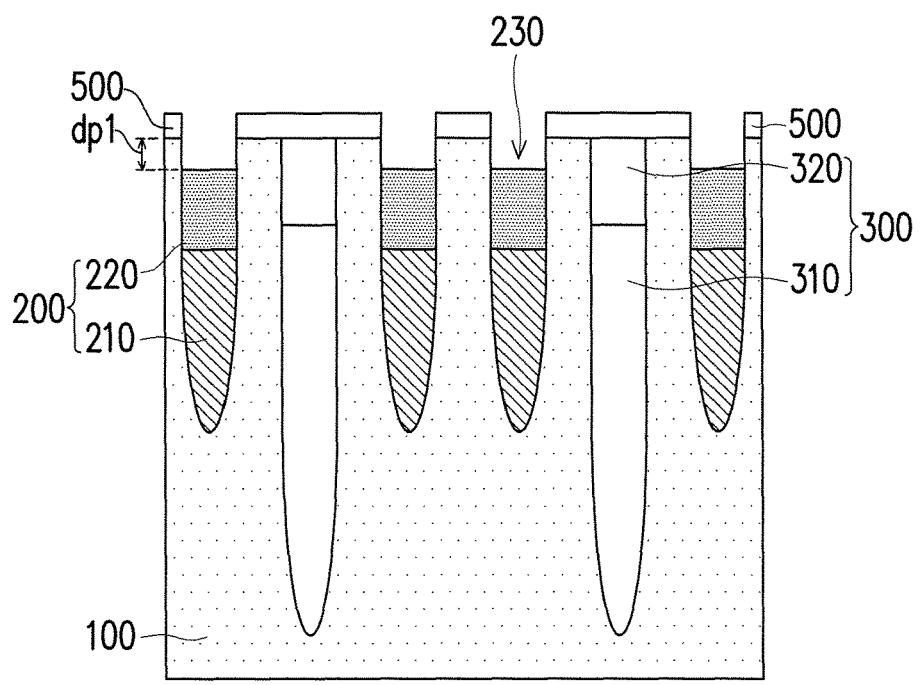
Figure 2C:
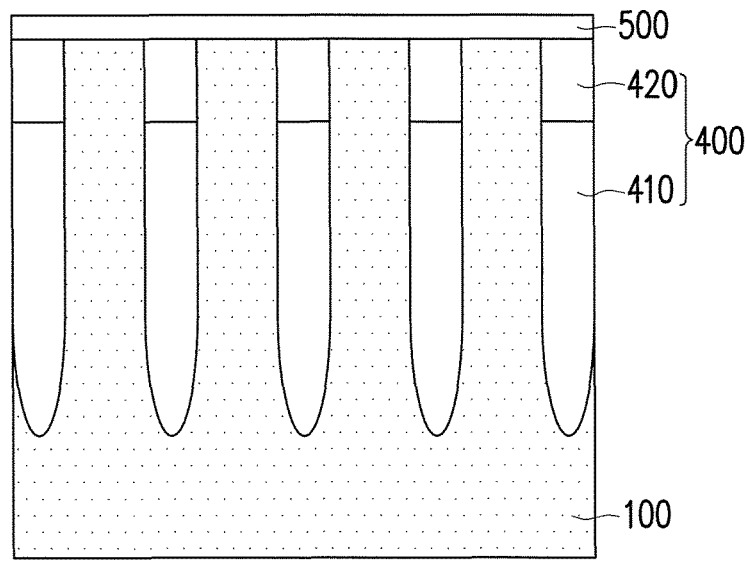
Figure 2D:
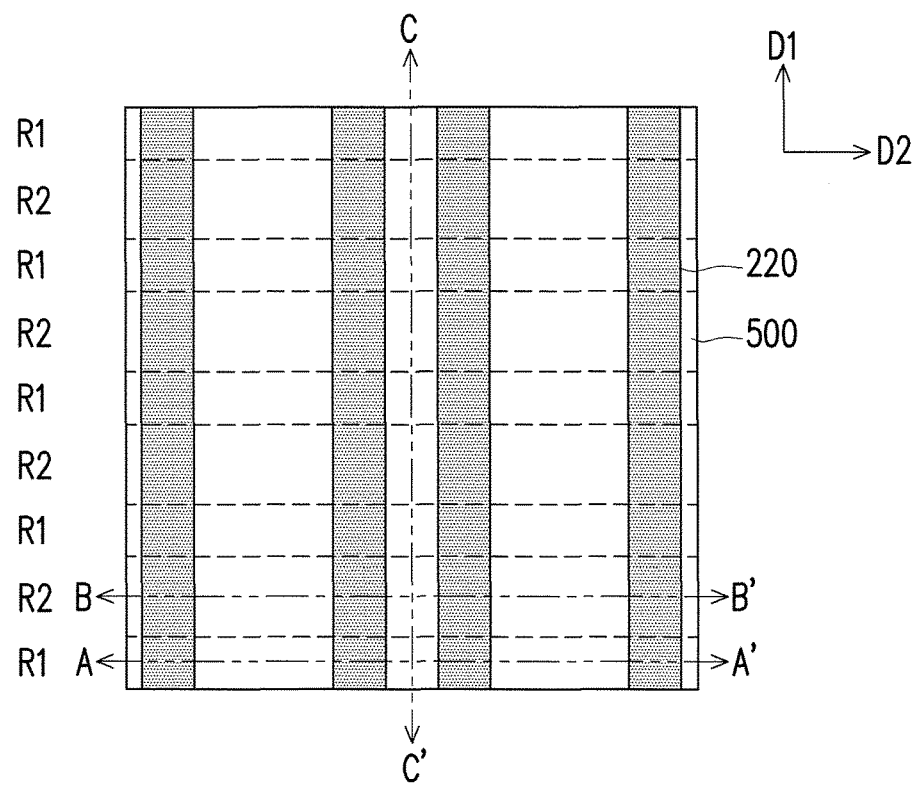
Figure 3A:
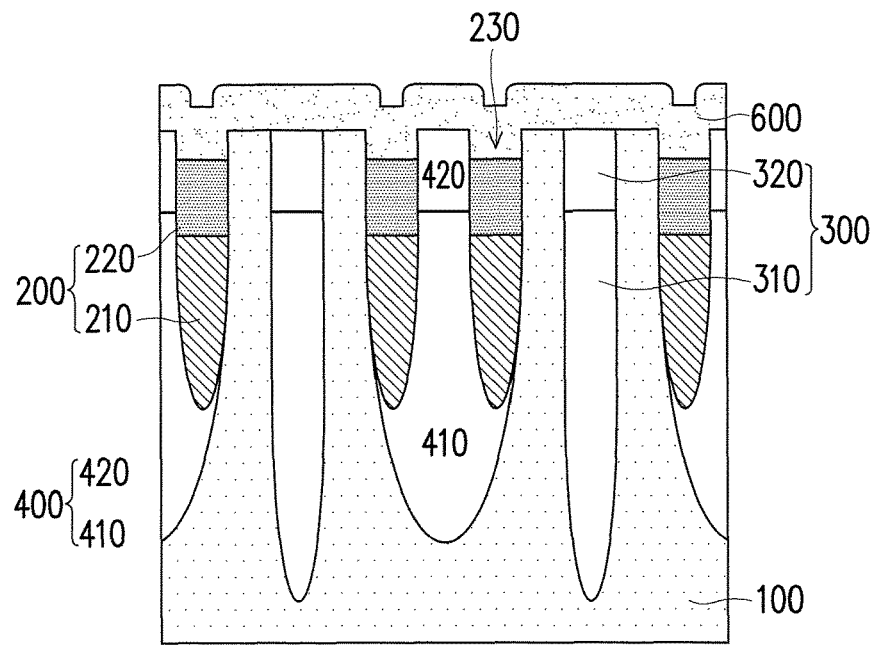
Figure 3B:
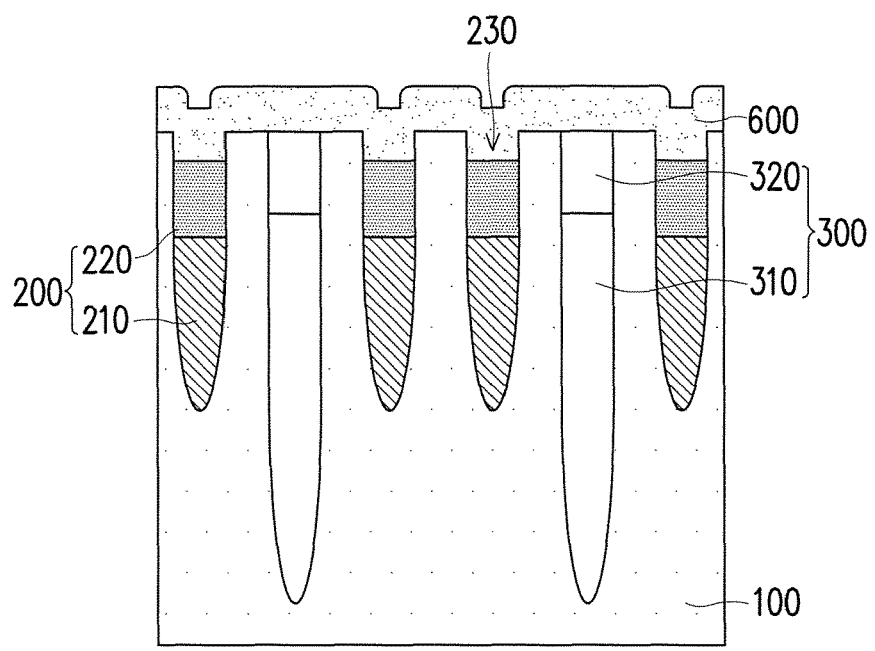
Figure 3C:
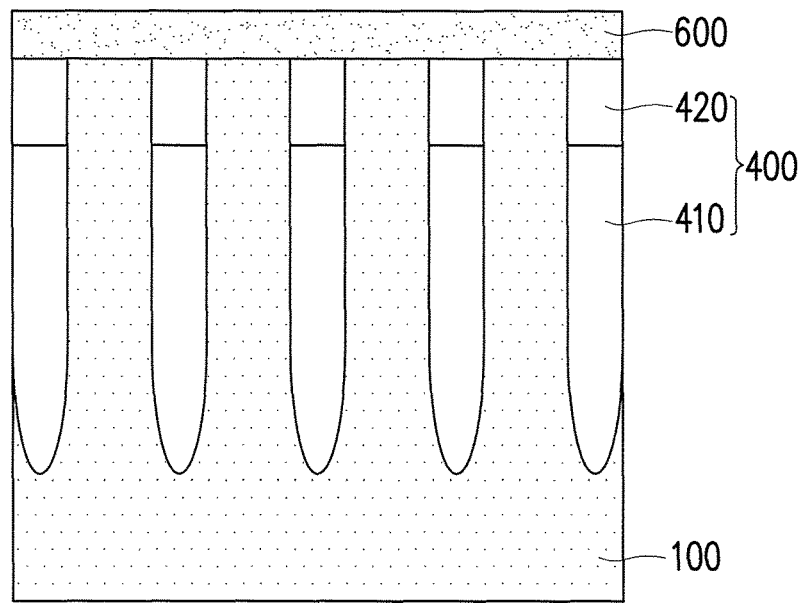
Figure 3D:
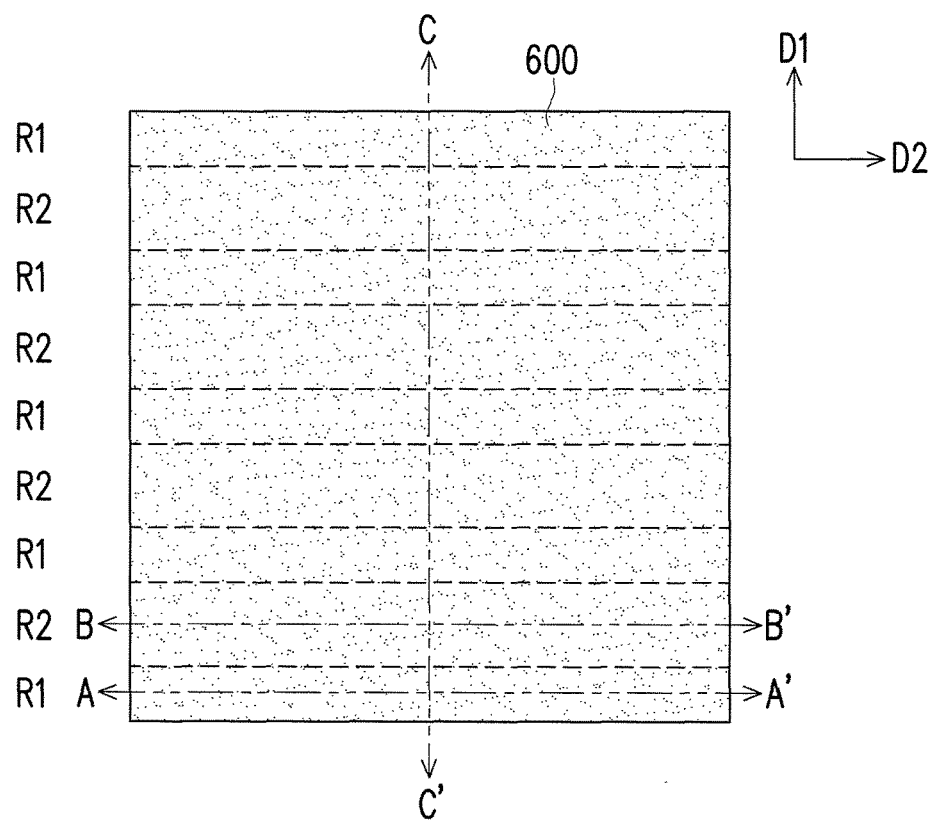
Figure 4A:
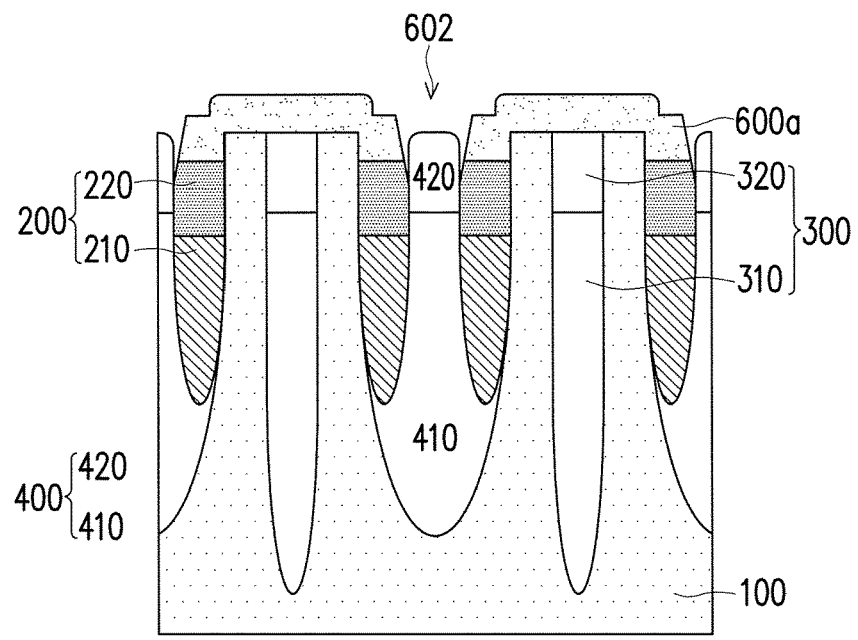
Figure 4B:
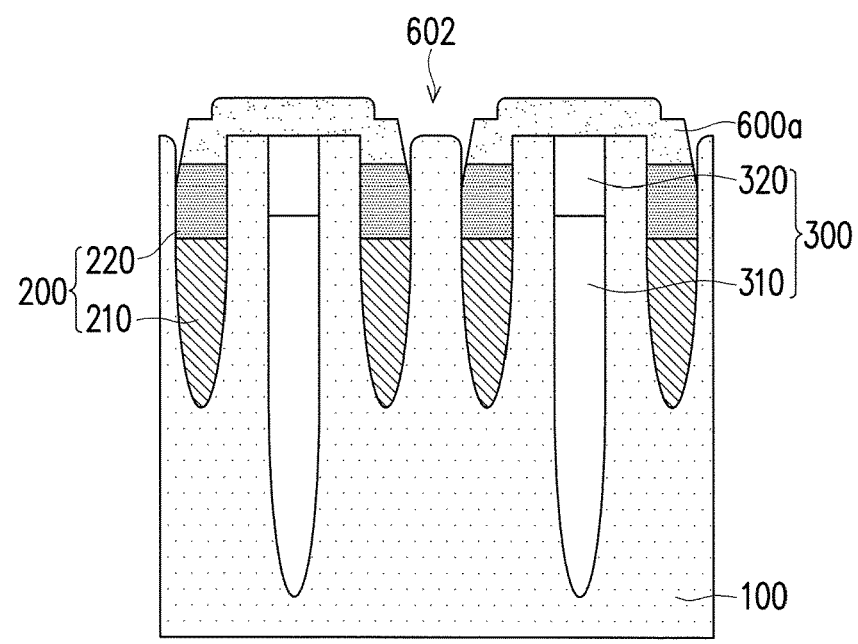
Figure 4C:
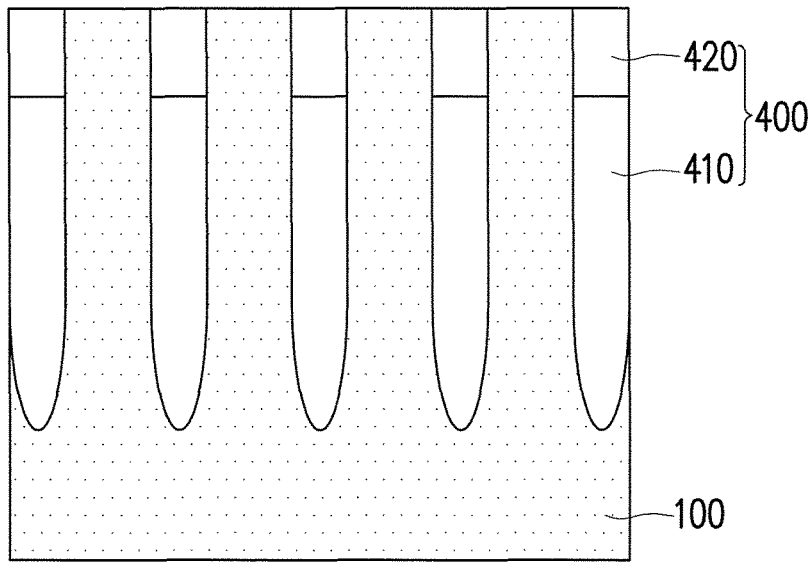
Figure 4D:
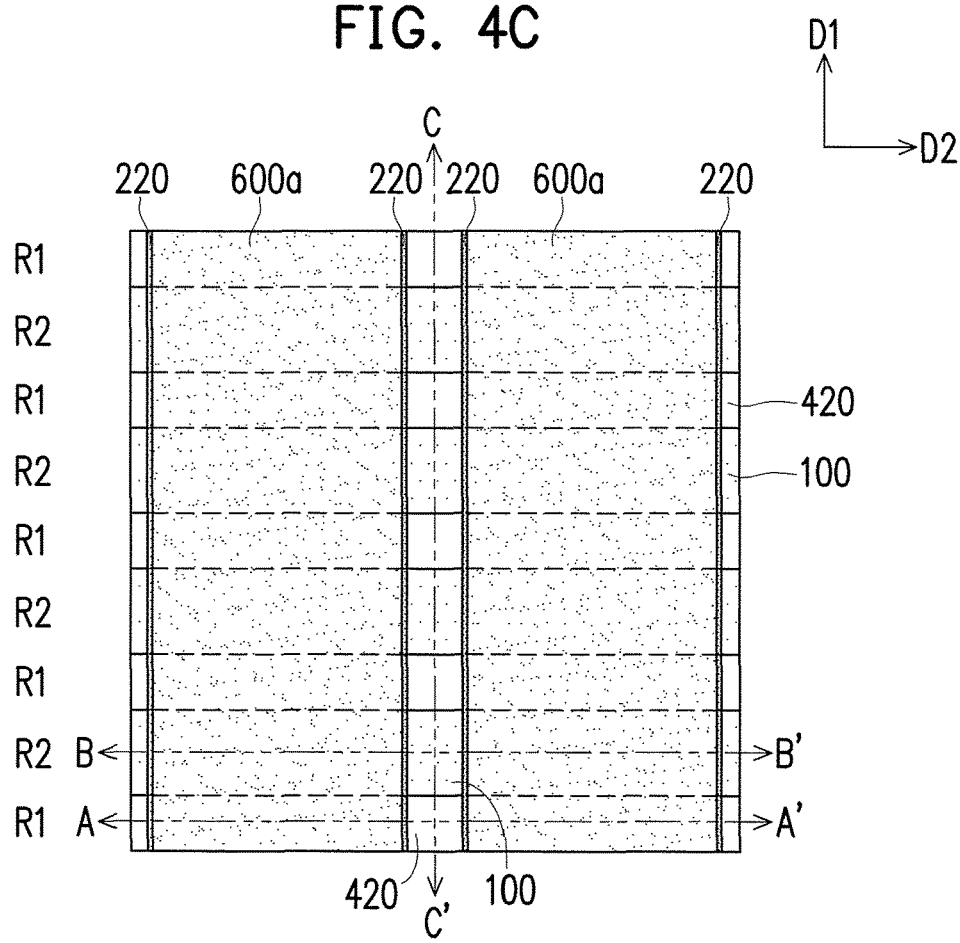
Figure 5A:
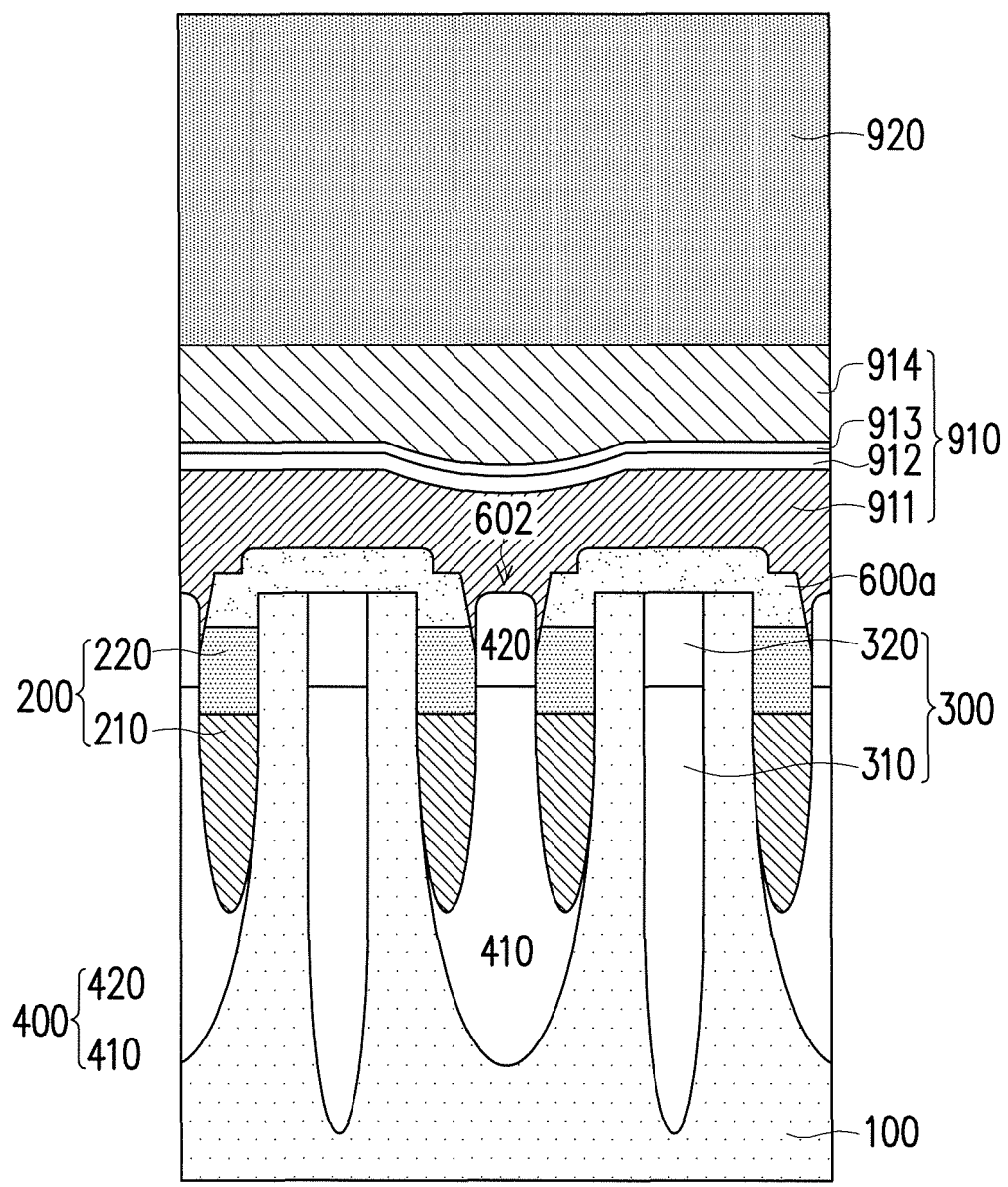
Figure 5B:
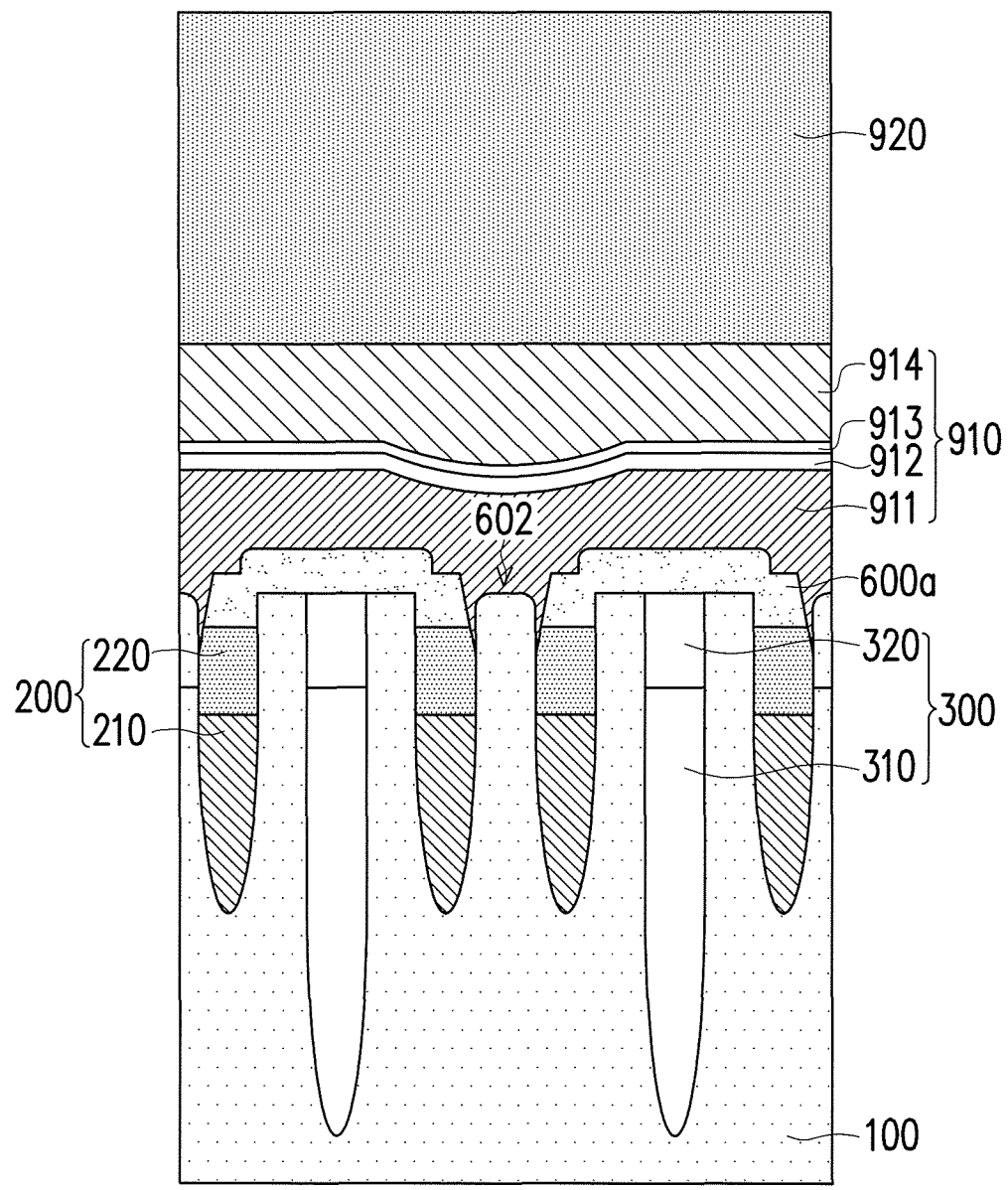
Figure 5C:
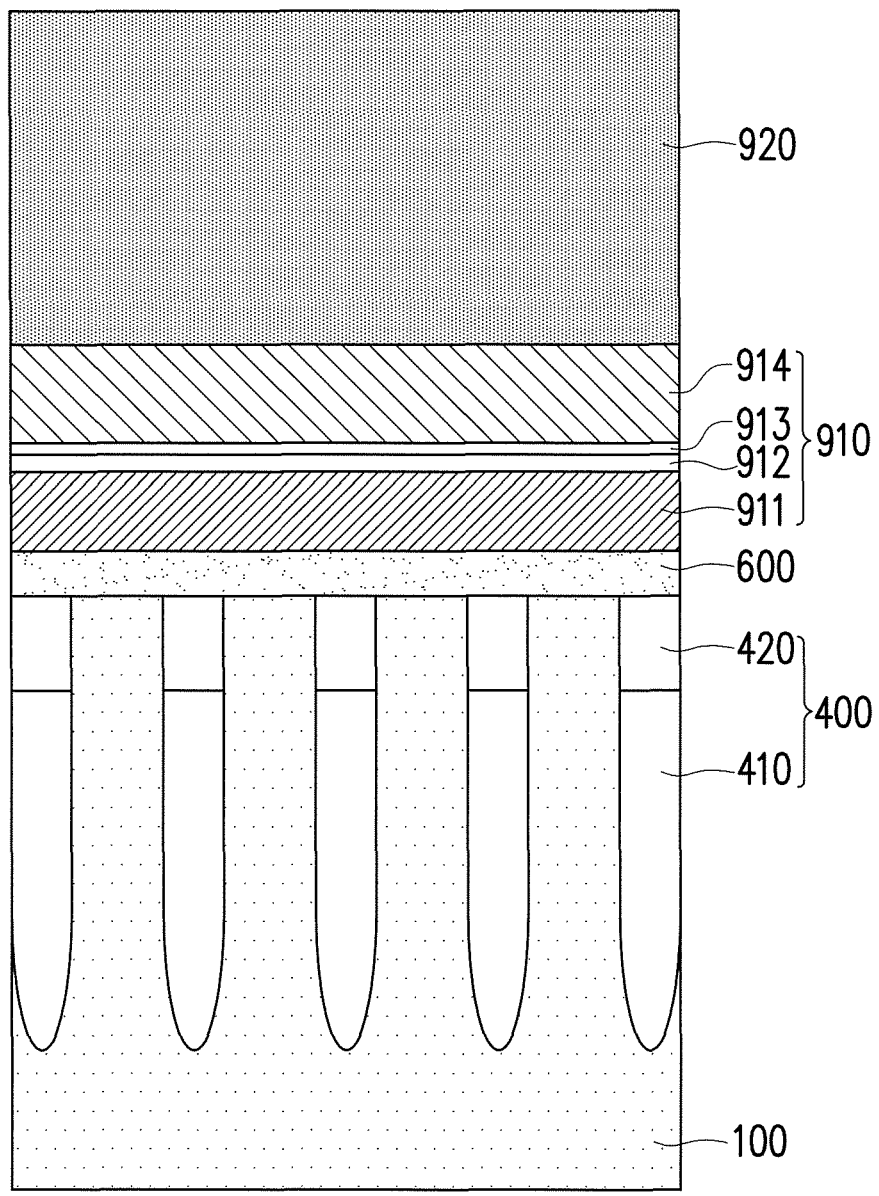
Figure 5D:
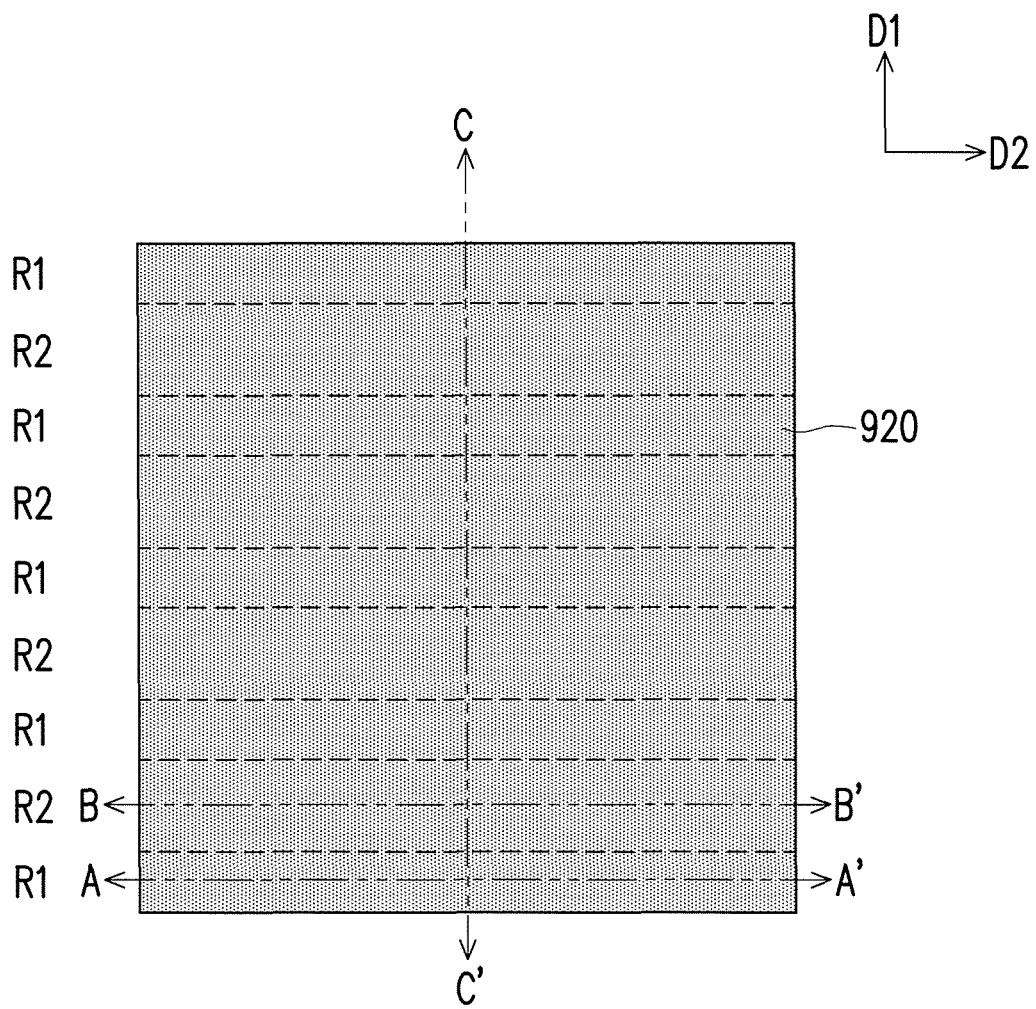
Figure 6A:
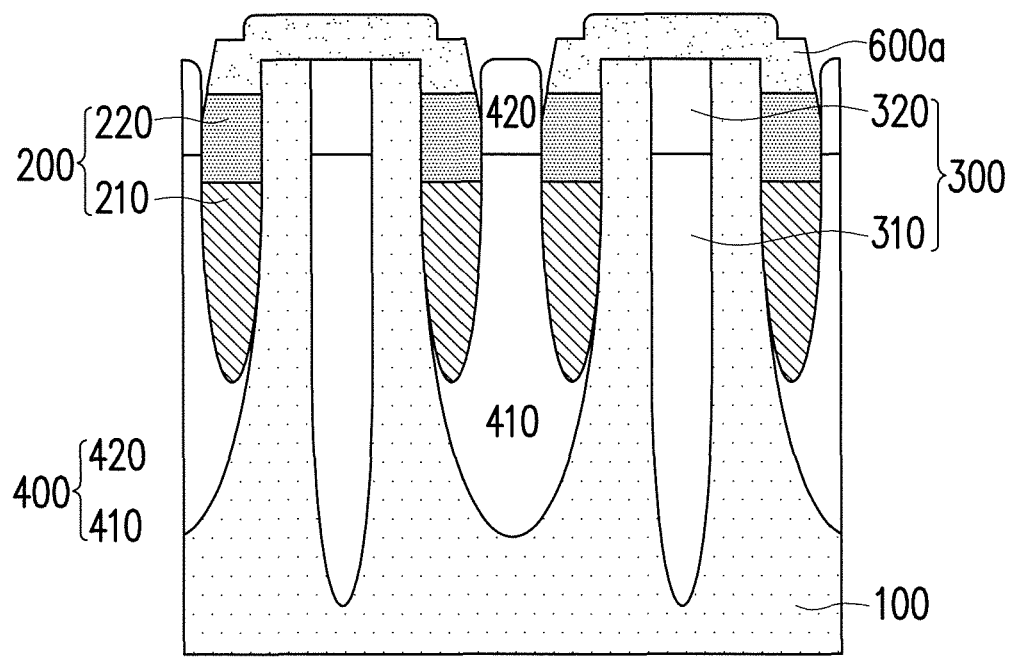
Figure 6B:
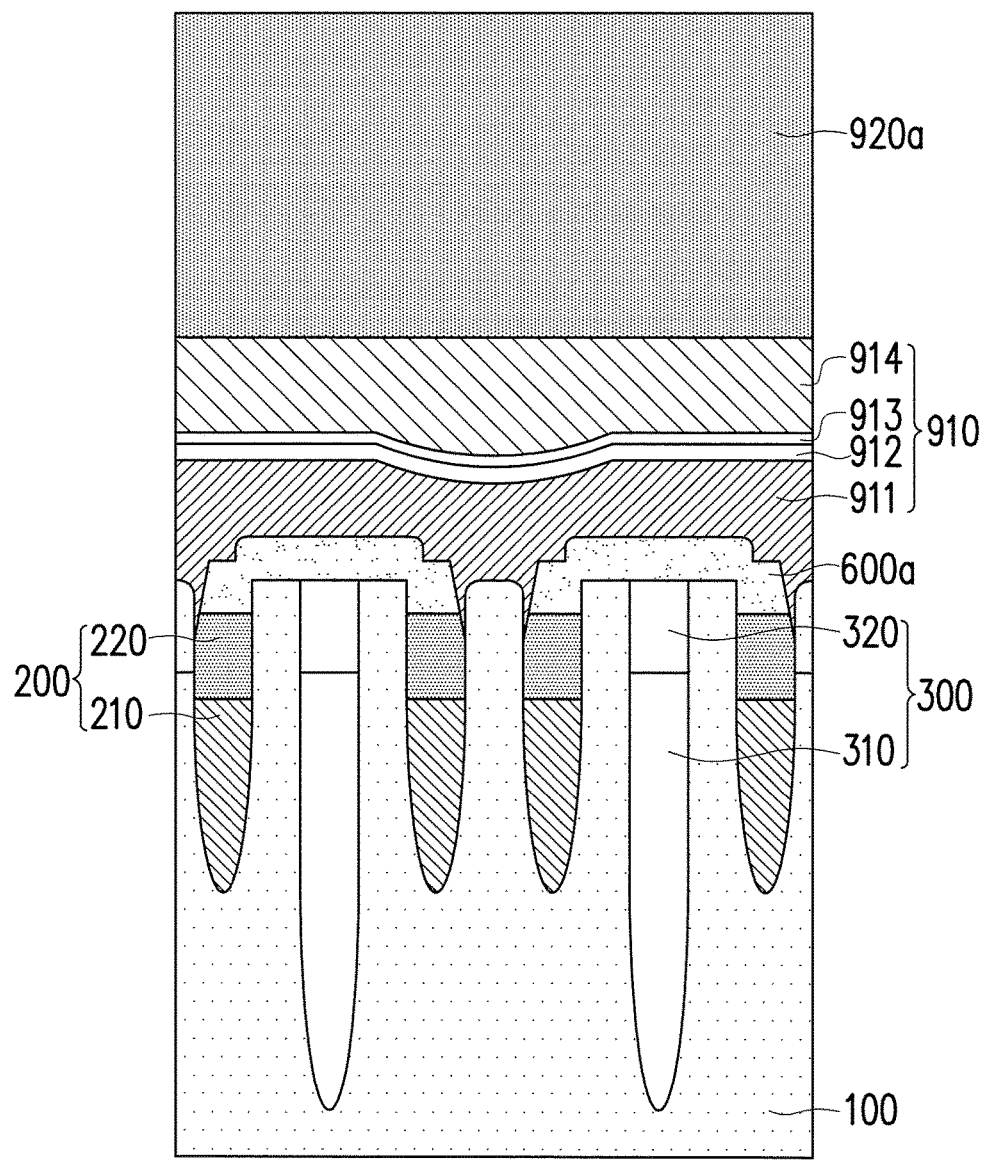
Figure 6C:
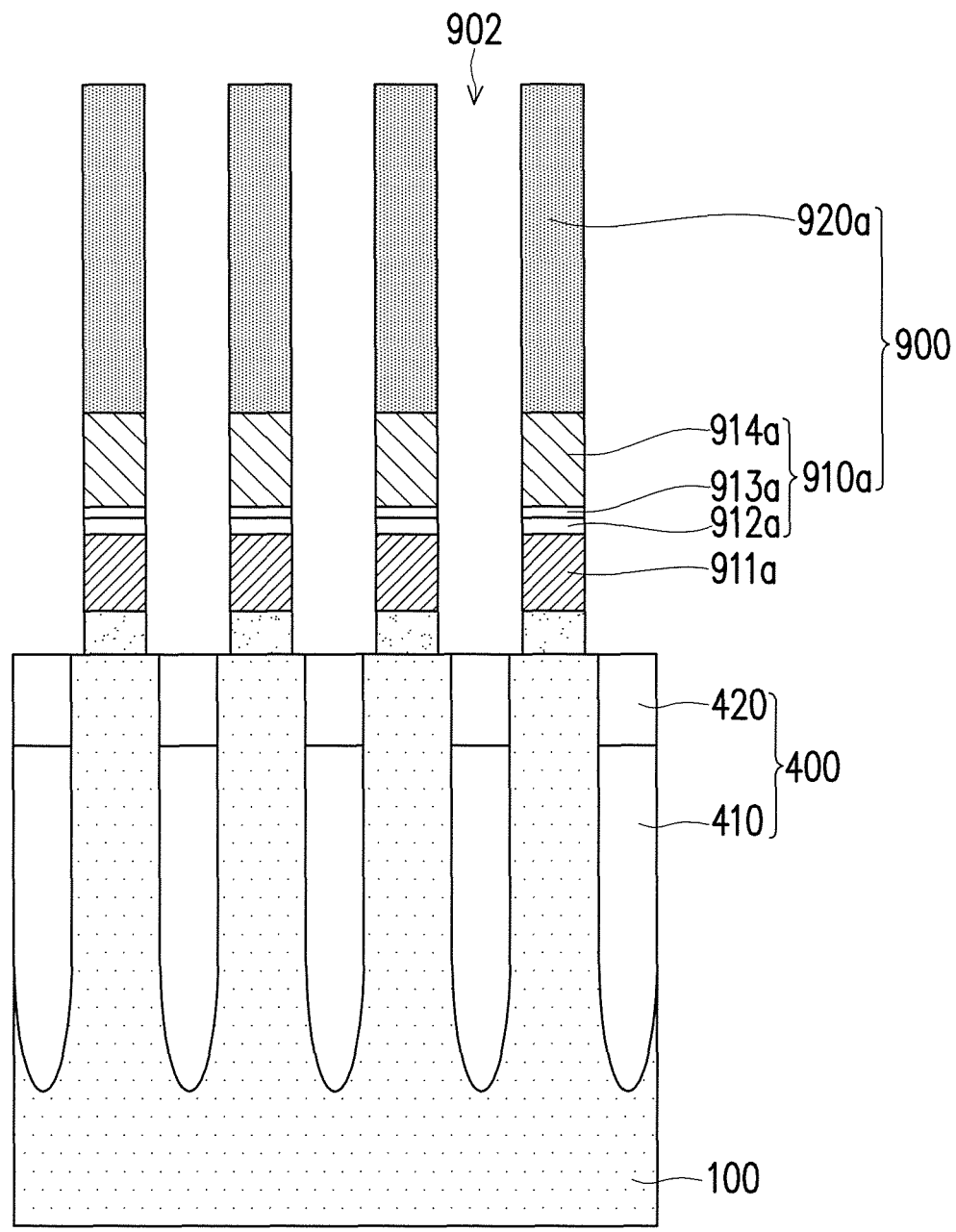
Figure 6D:
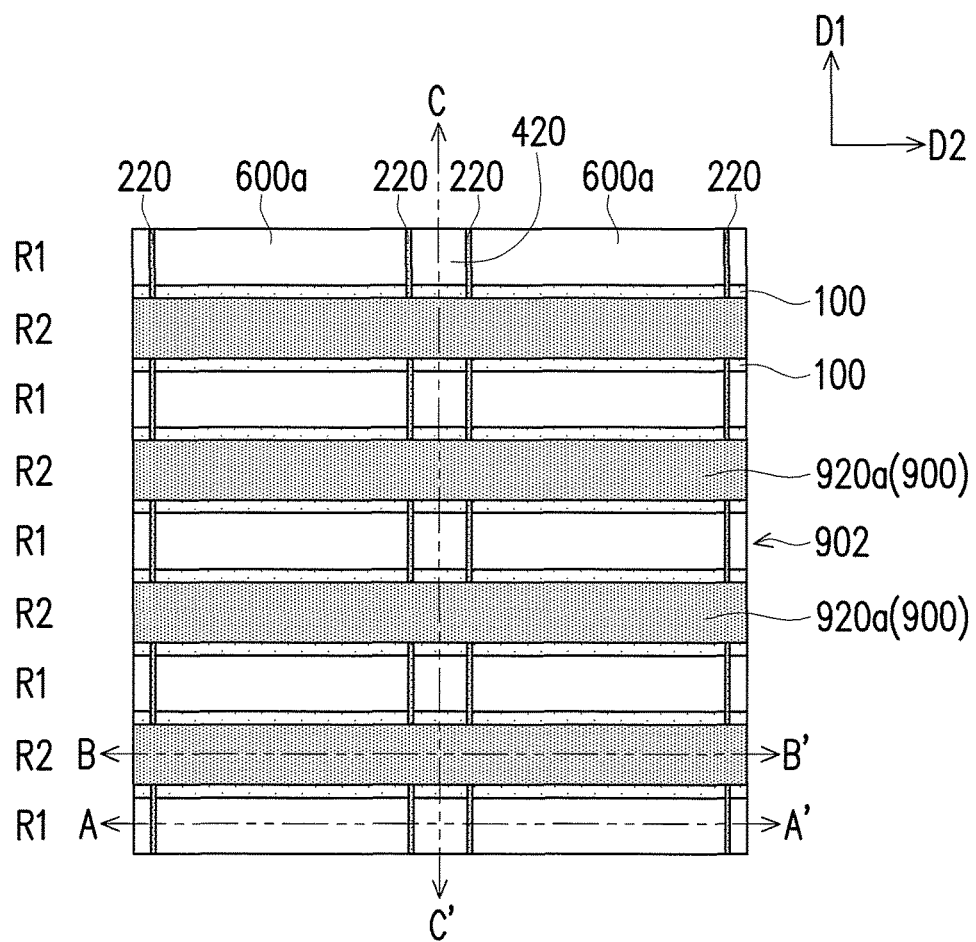
Figure 7A:
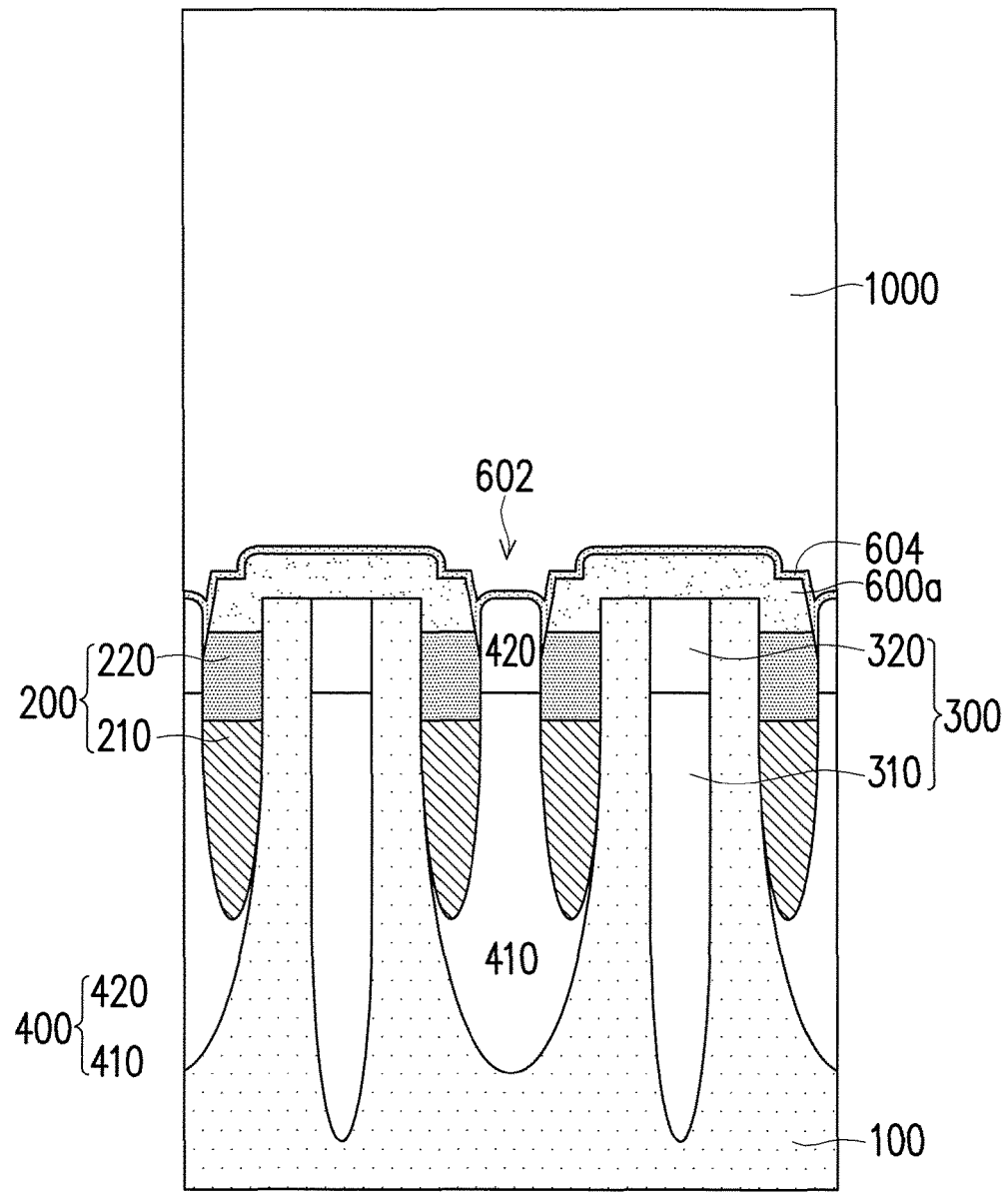
Figure 7B:
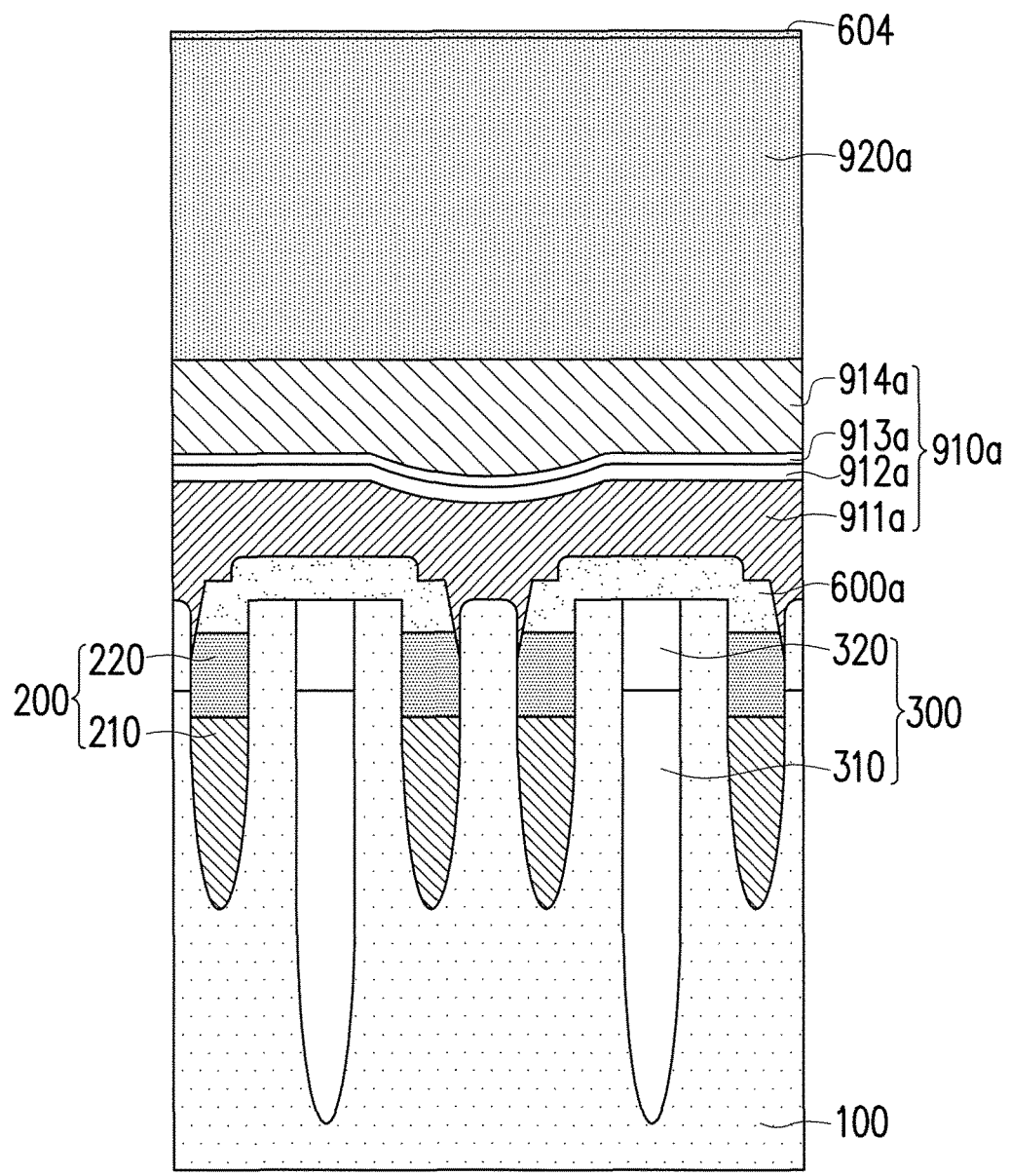
Figure 7C:
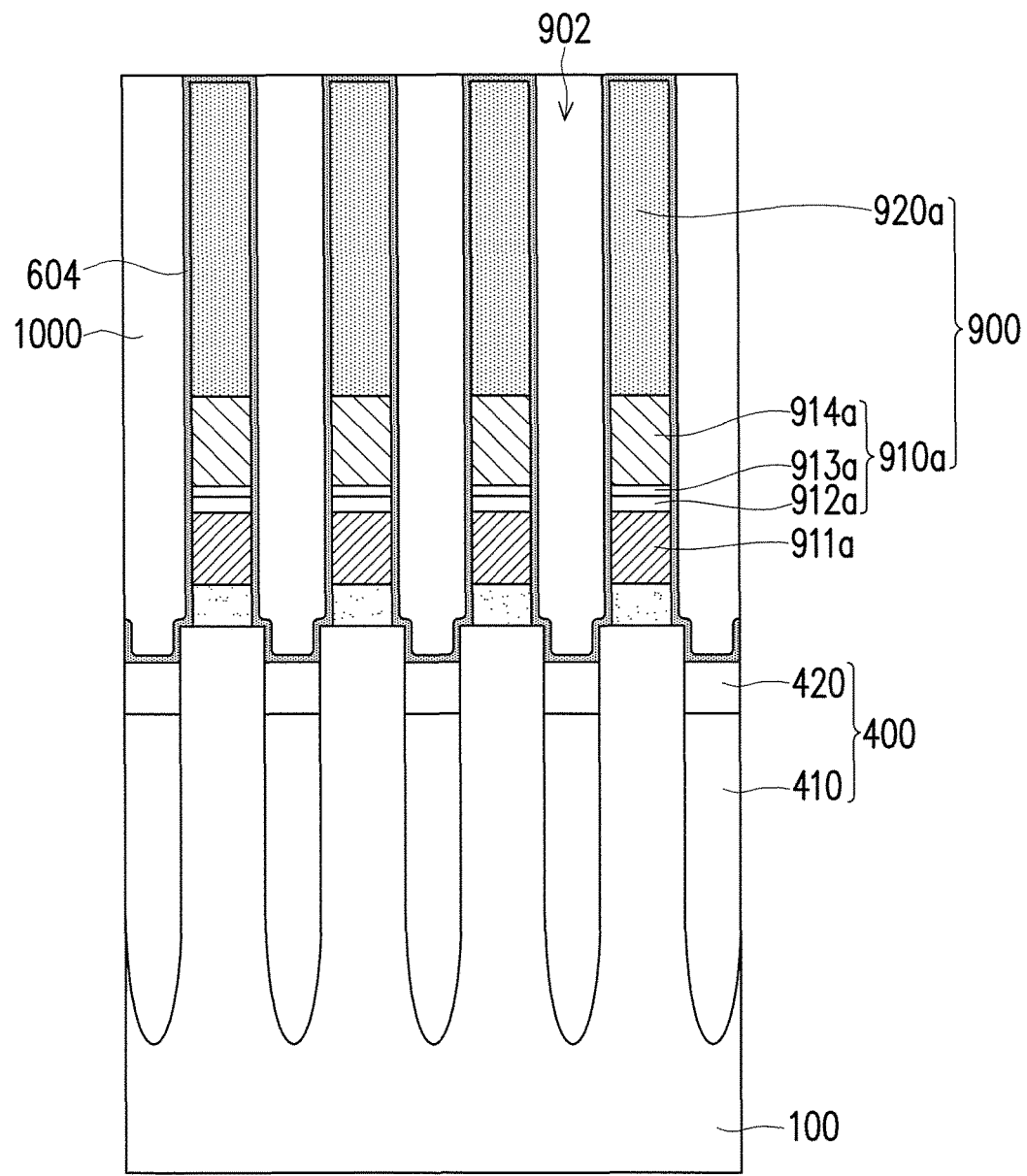
Figure 7D:
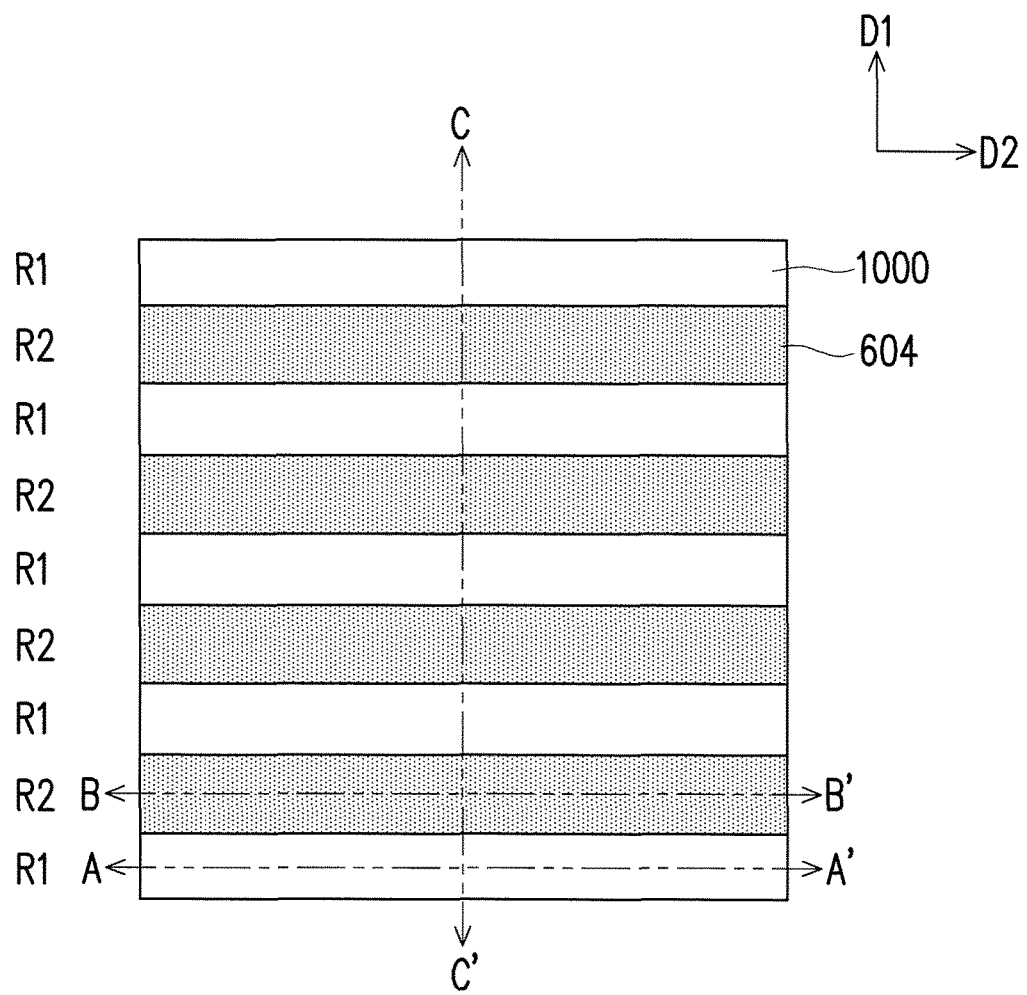
Figure 8A:
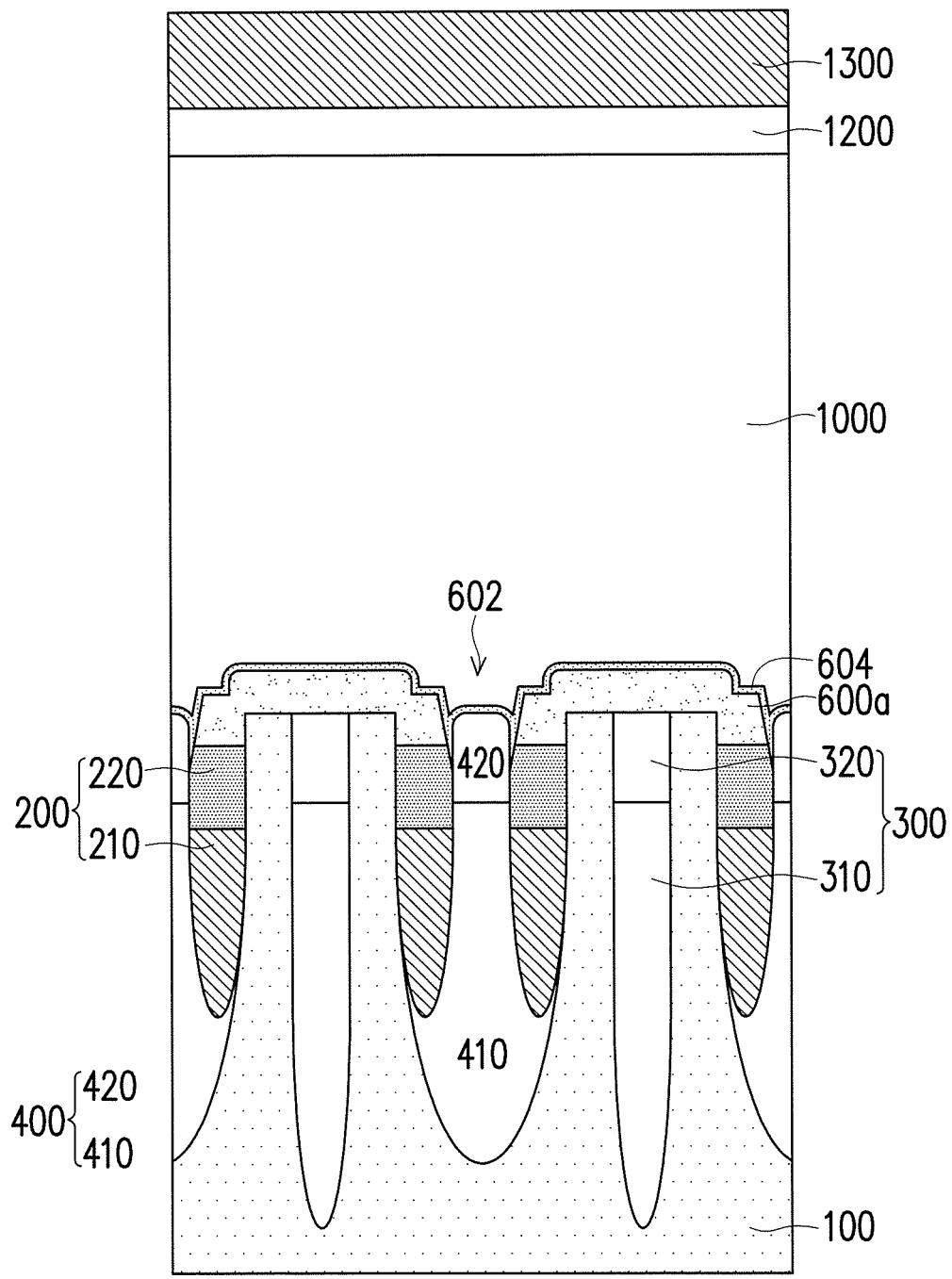
Figure 8B:
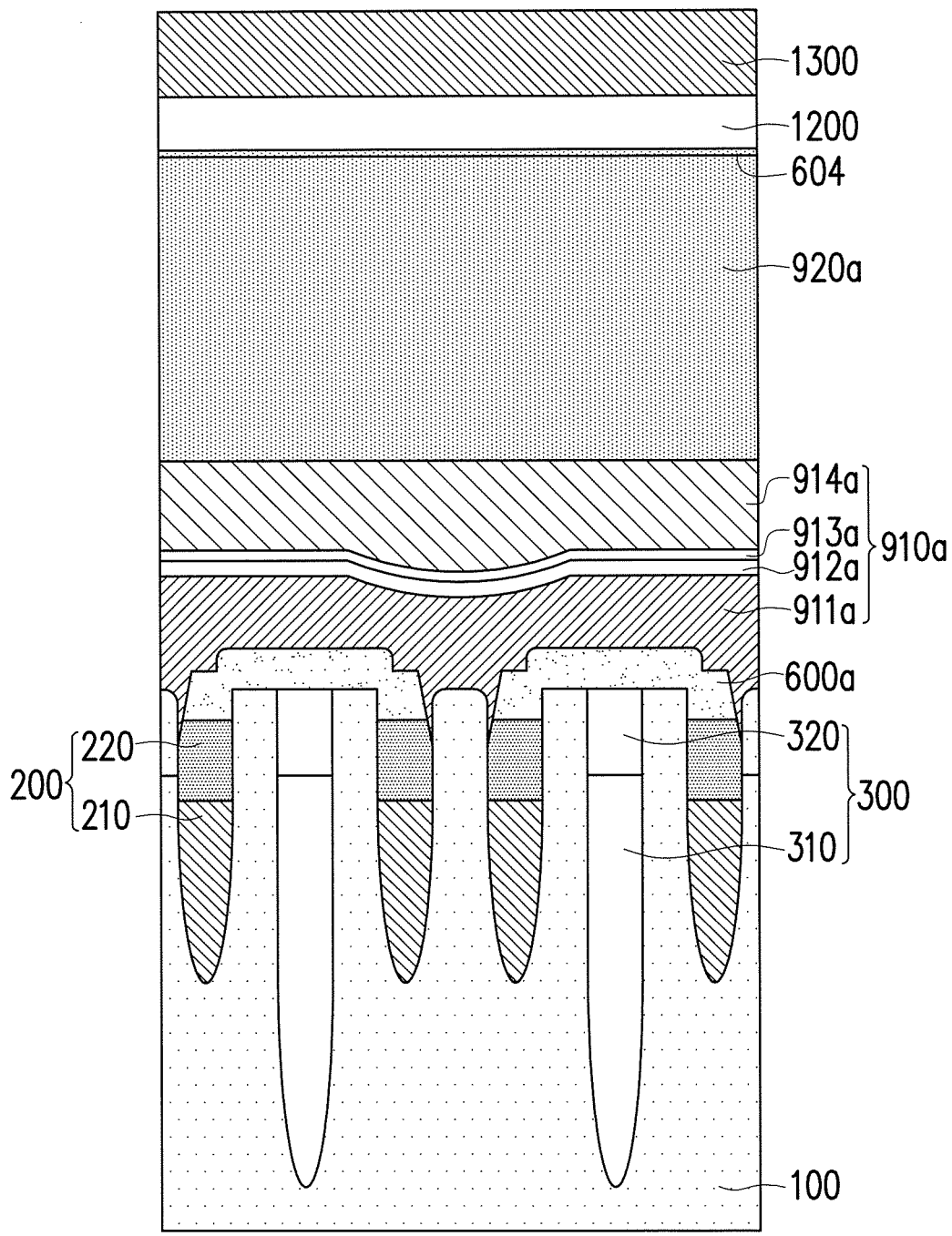
Figure 8C:
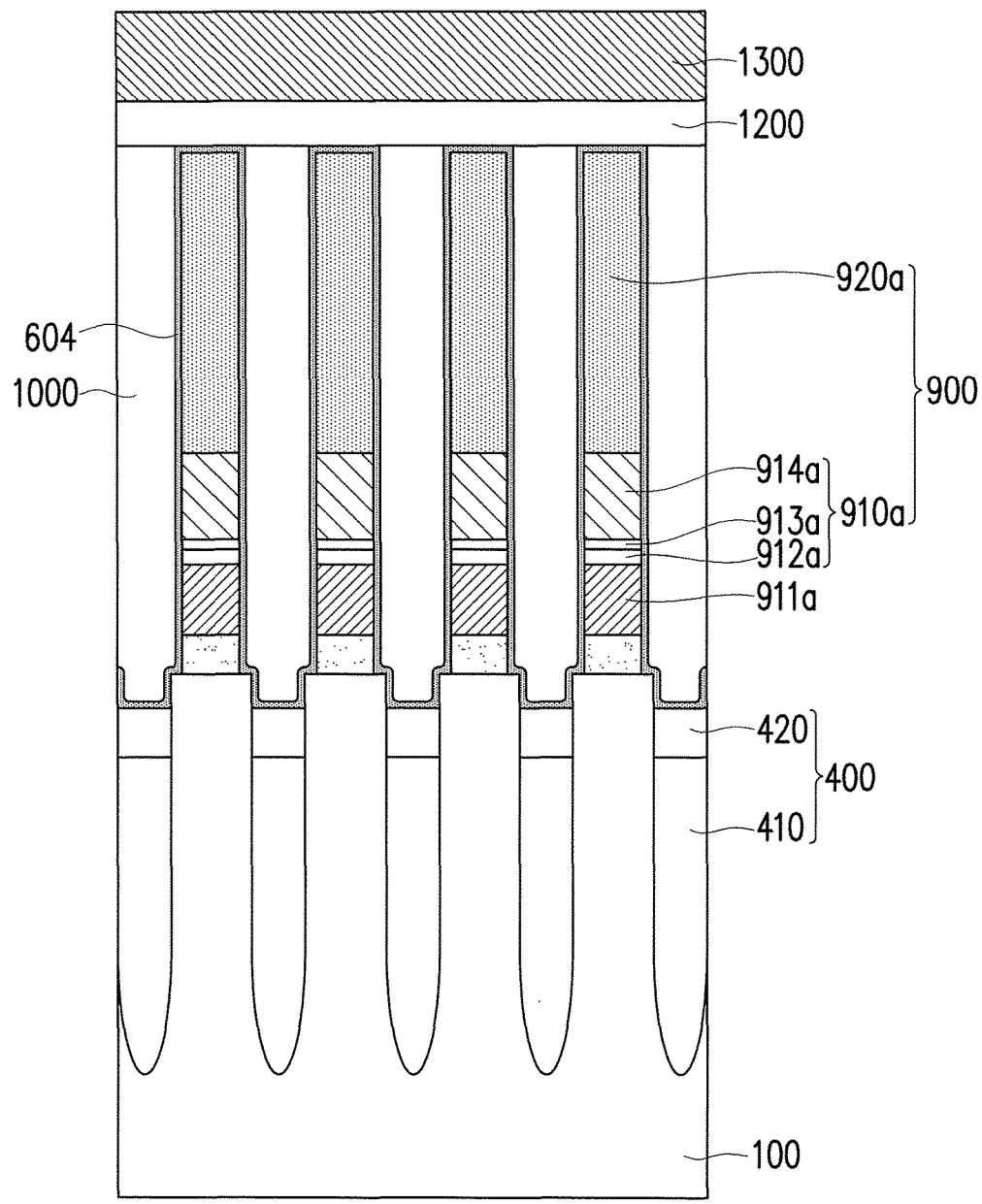
Figure 8D:
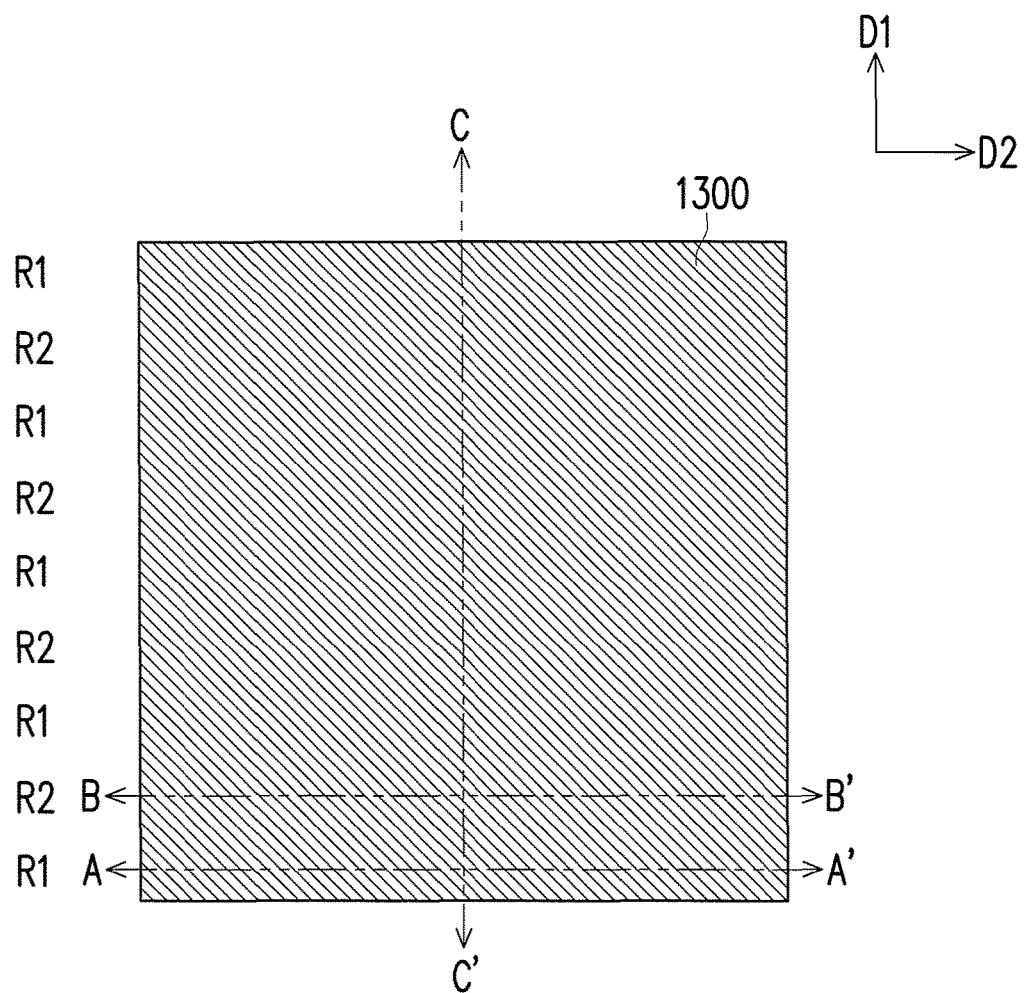
Figure 9A:
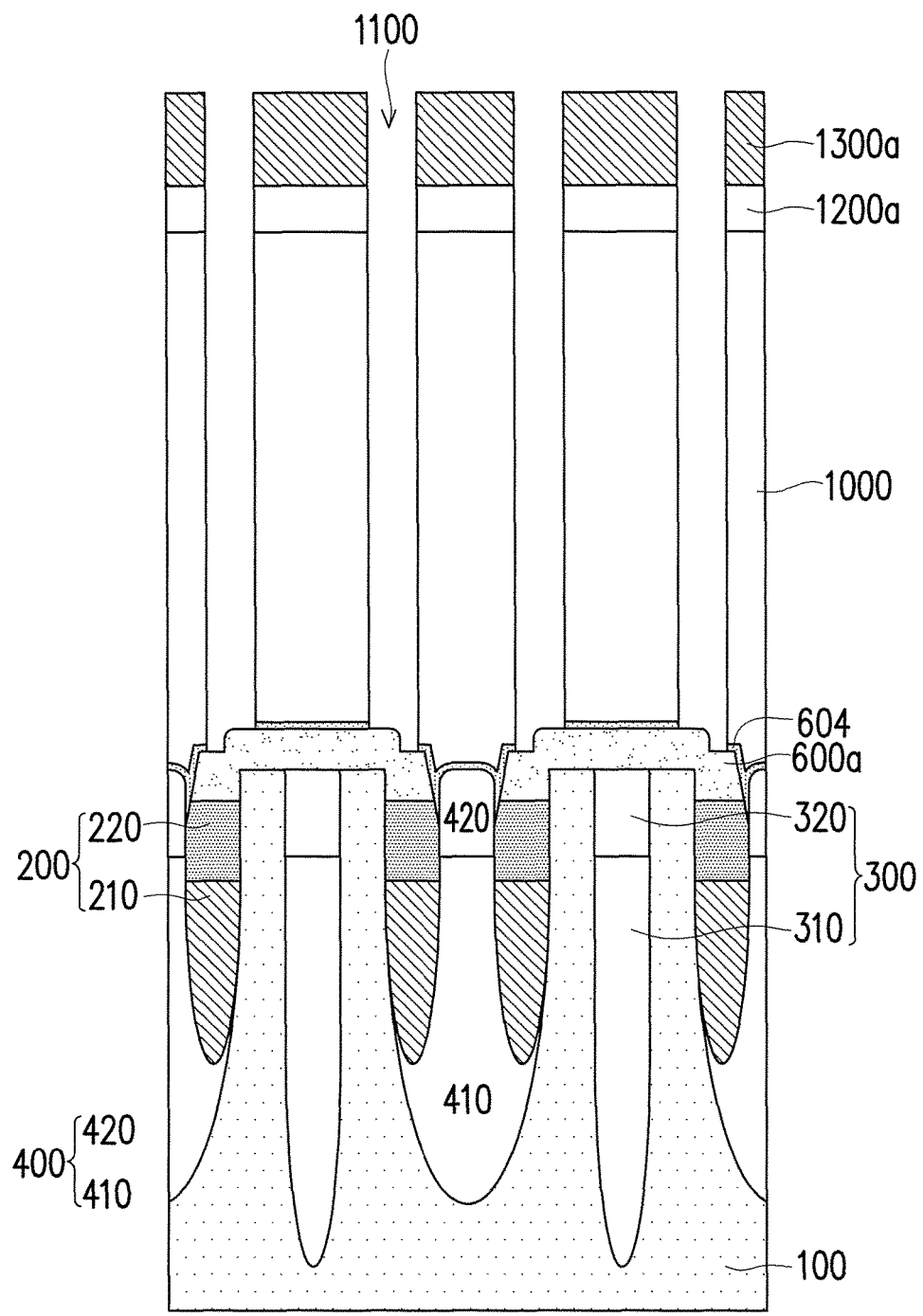
Figure 9B:
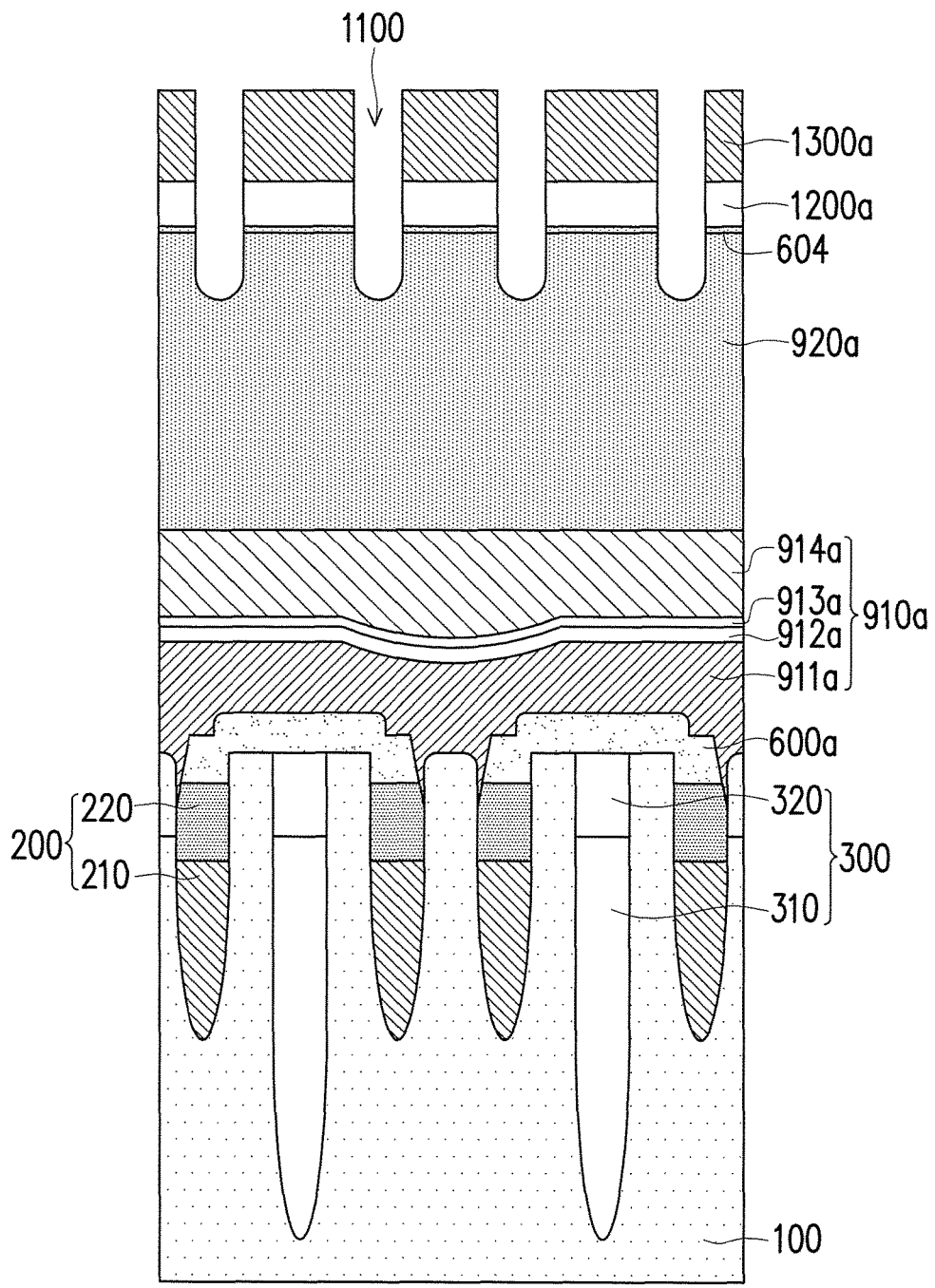
Figure 9C:
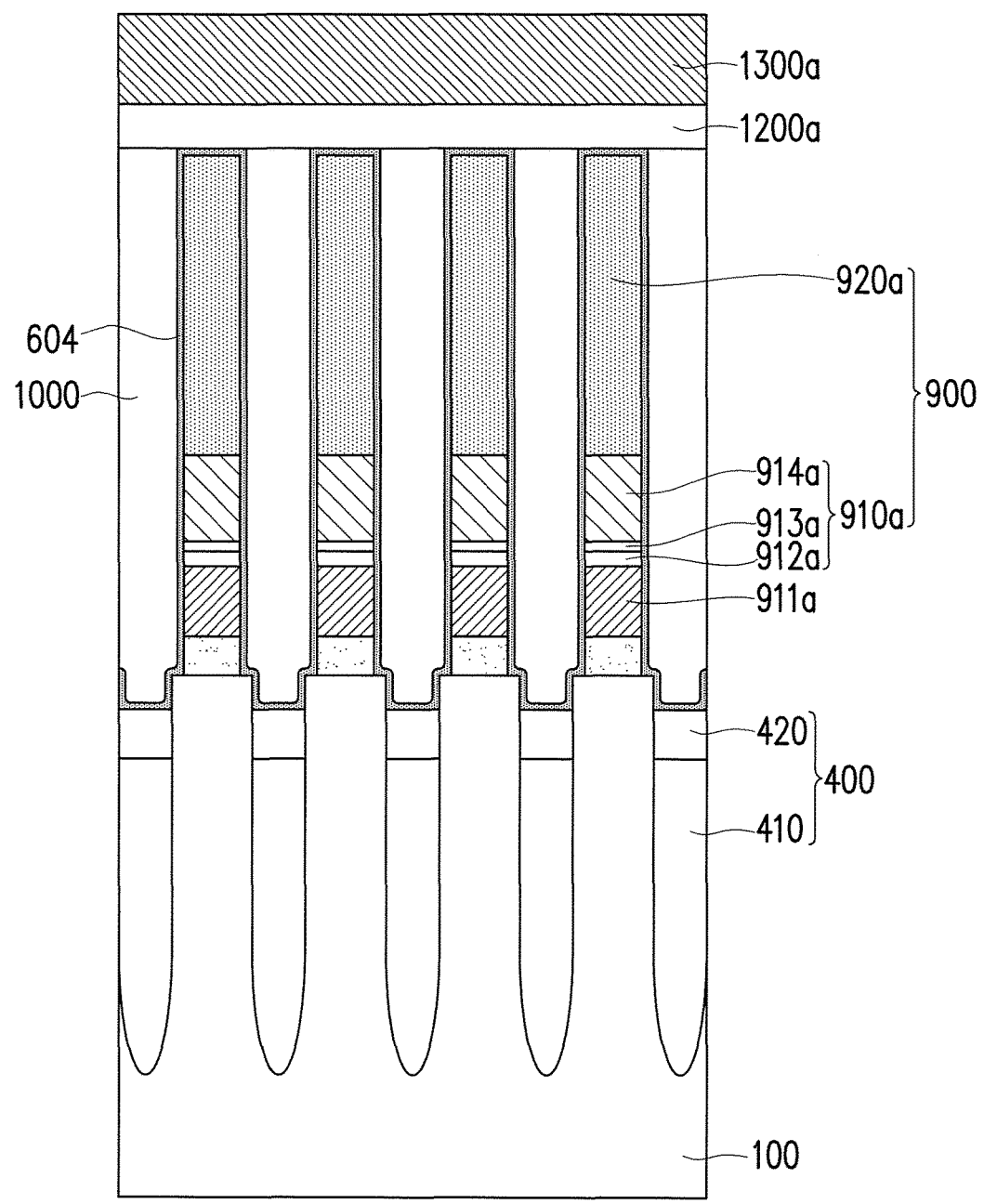
Figure 9D:
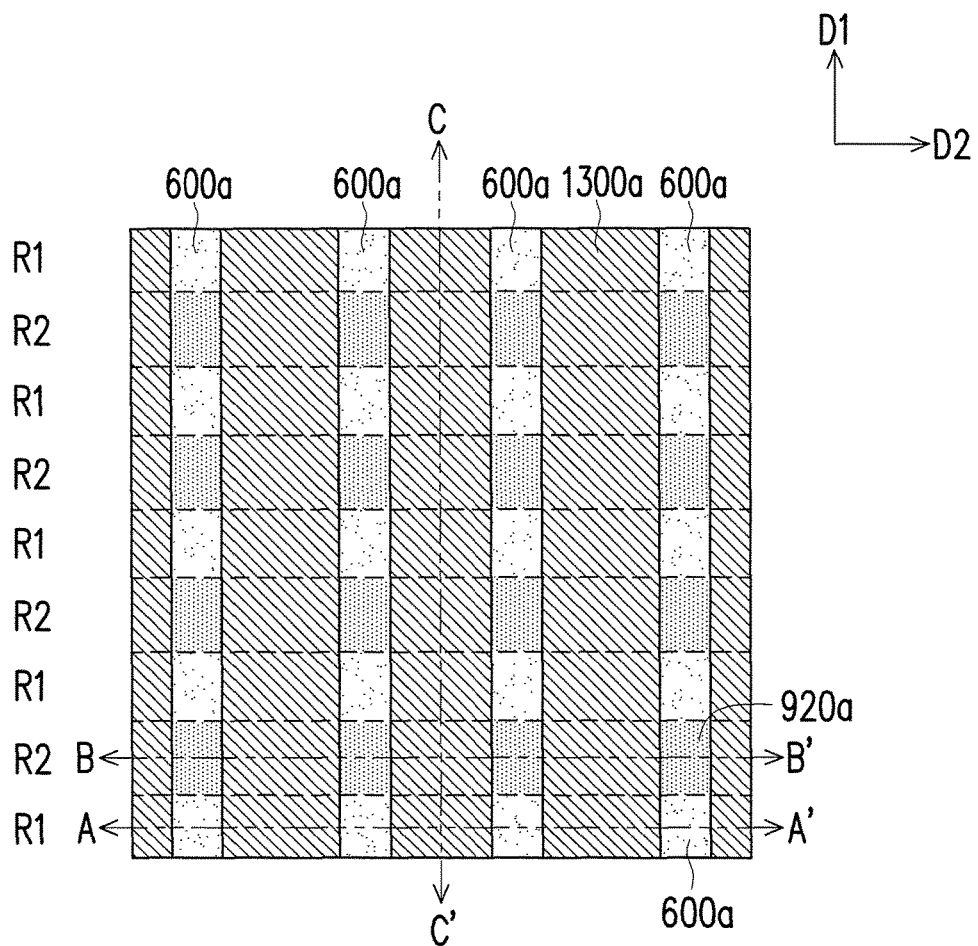
Figure 10A:
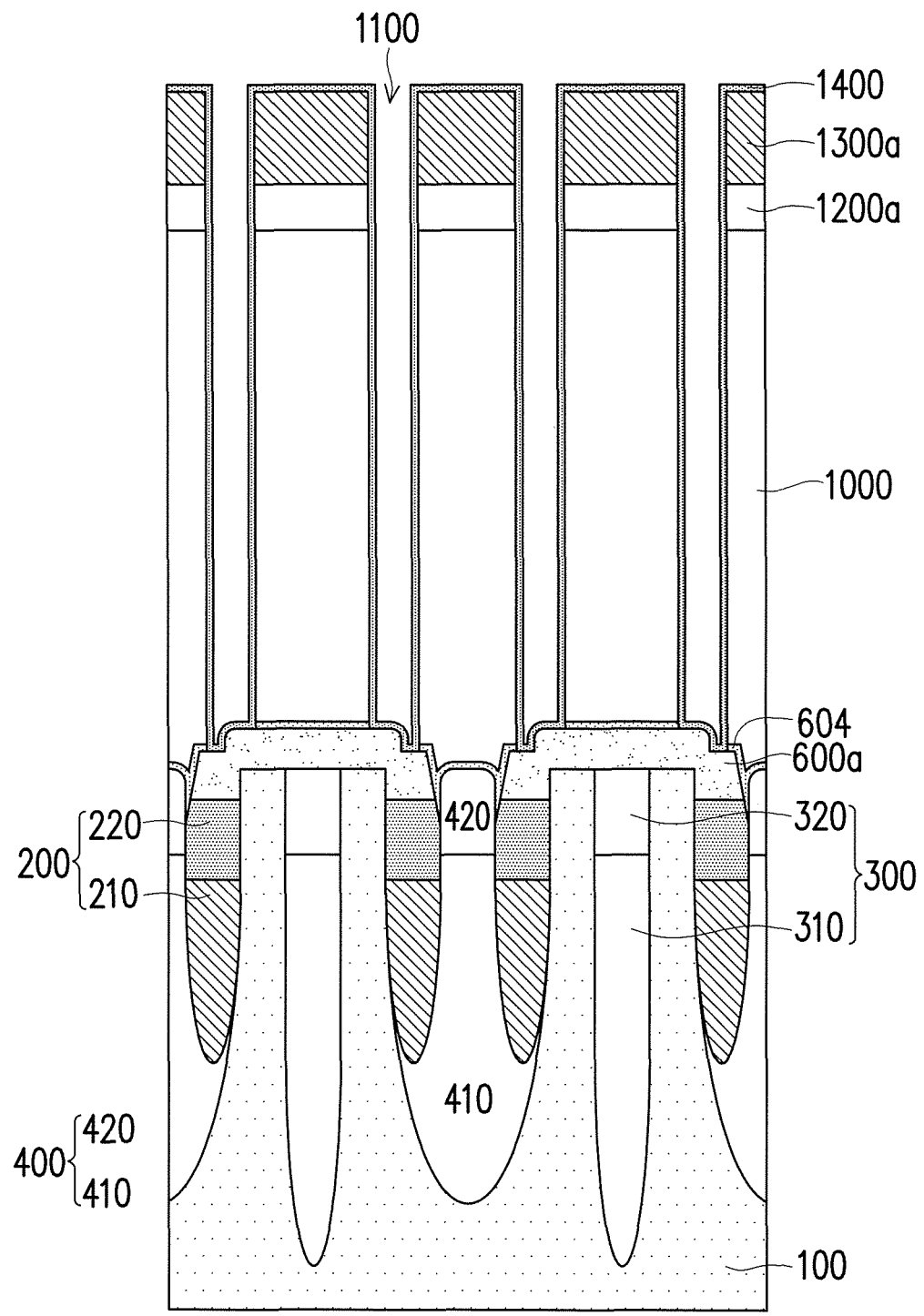
Figure 10B:
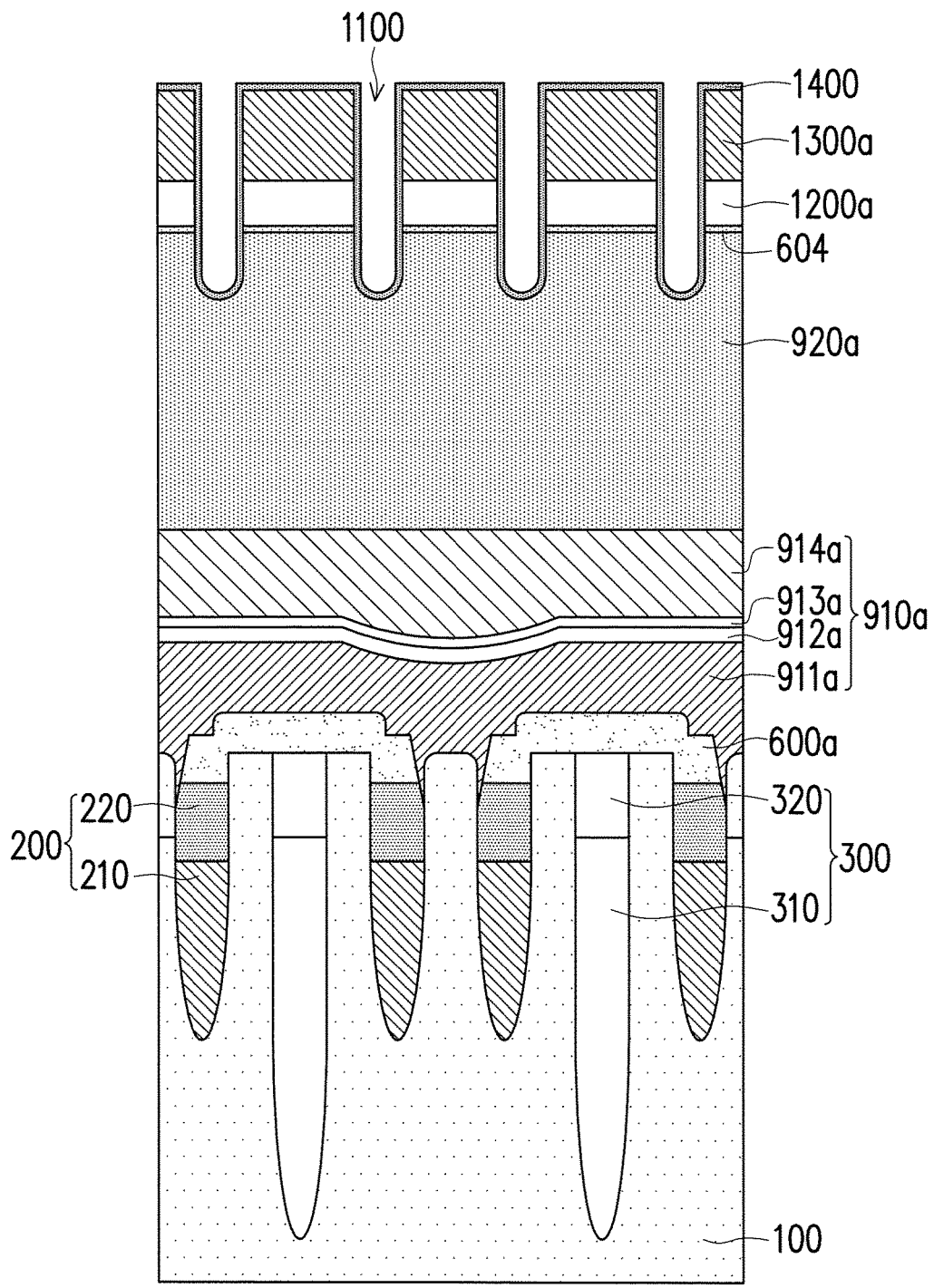
Figure 10C:
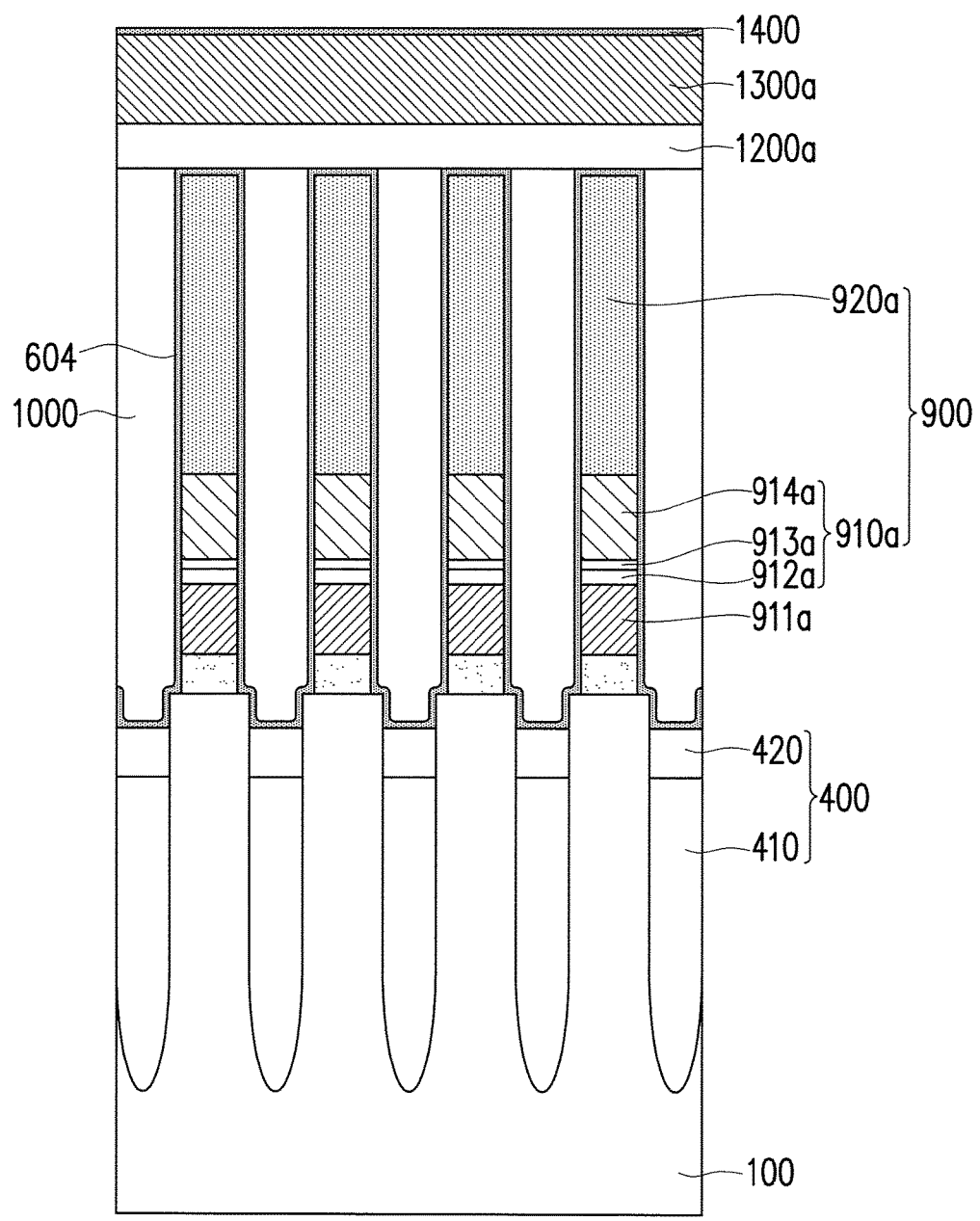
Figure 10D:
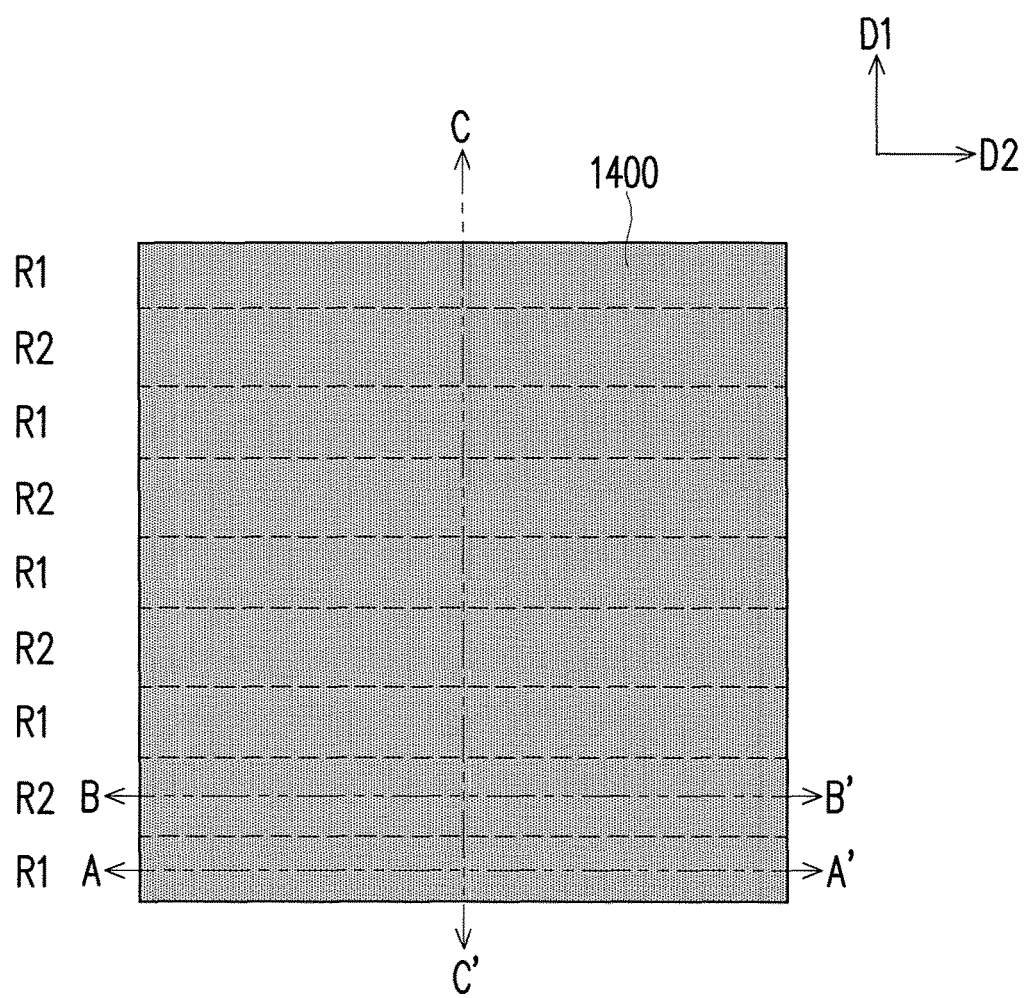
Figure 11A:
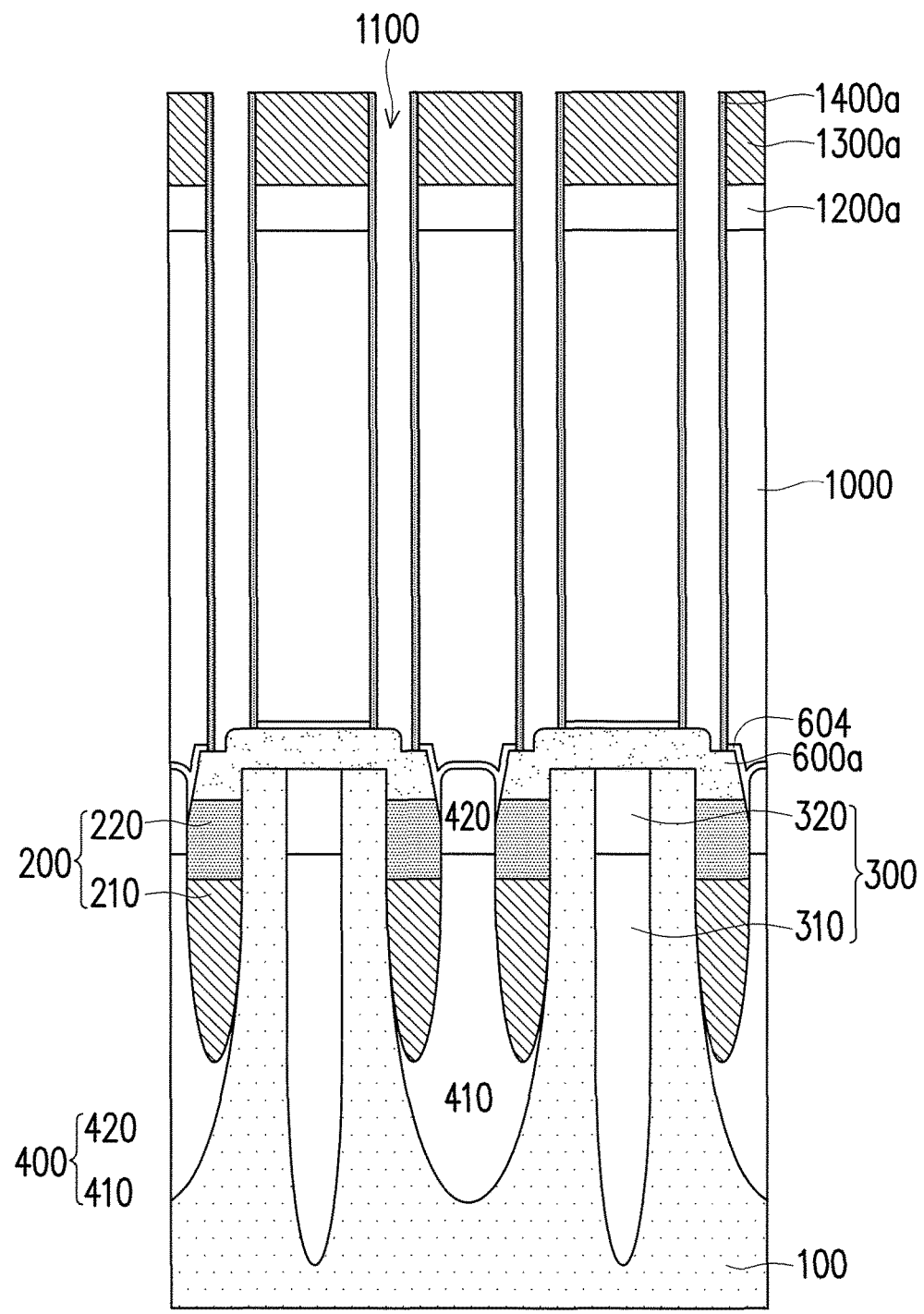
Figure 11B:
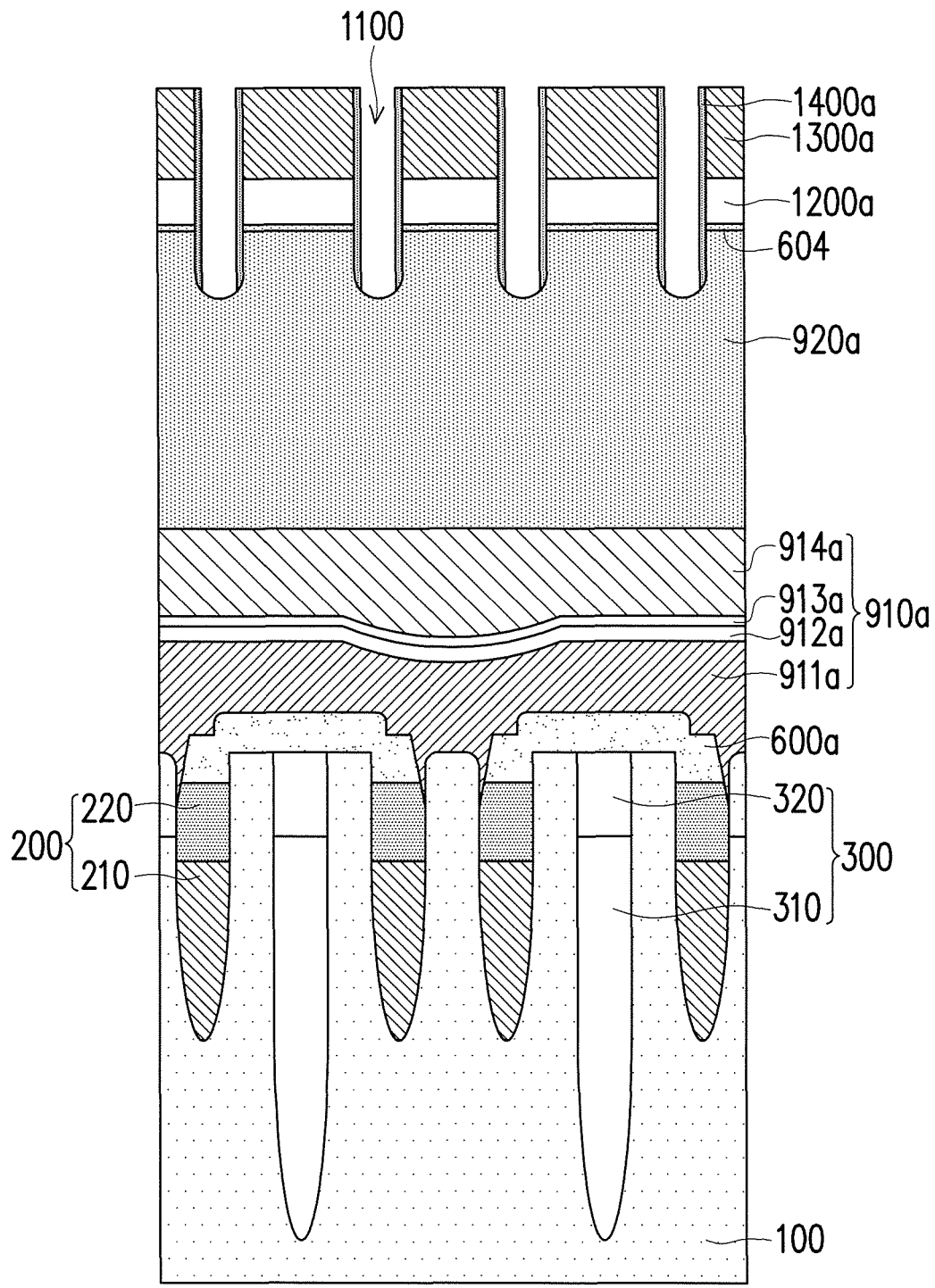
Figure 11C:
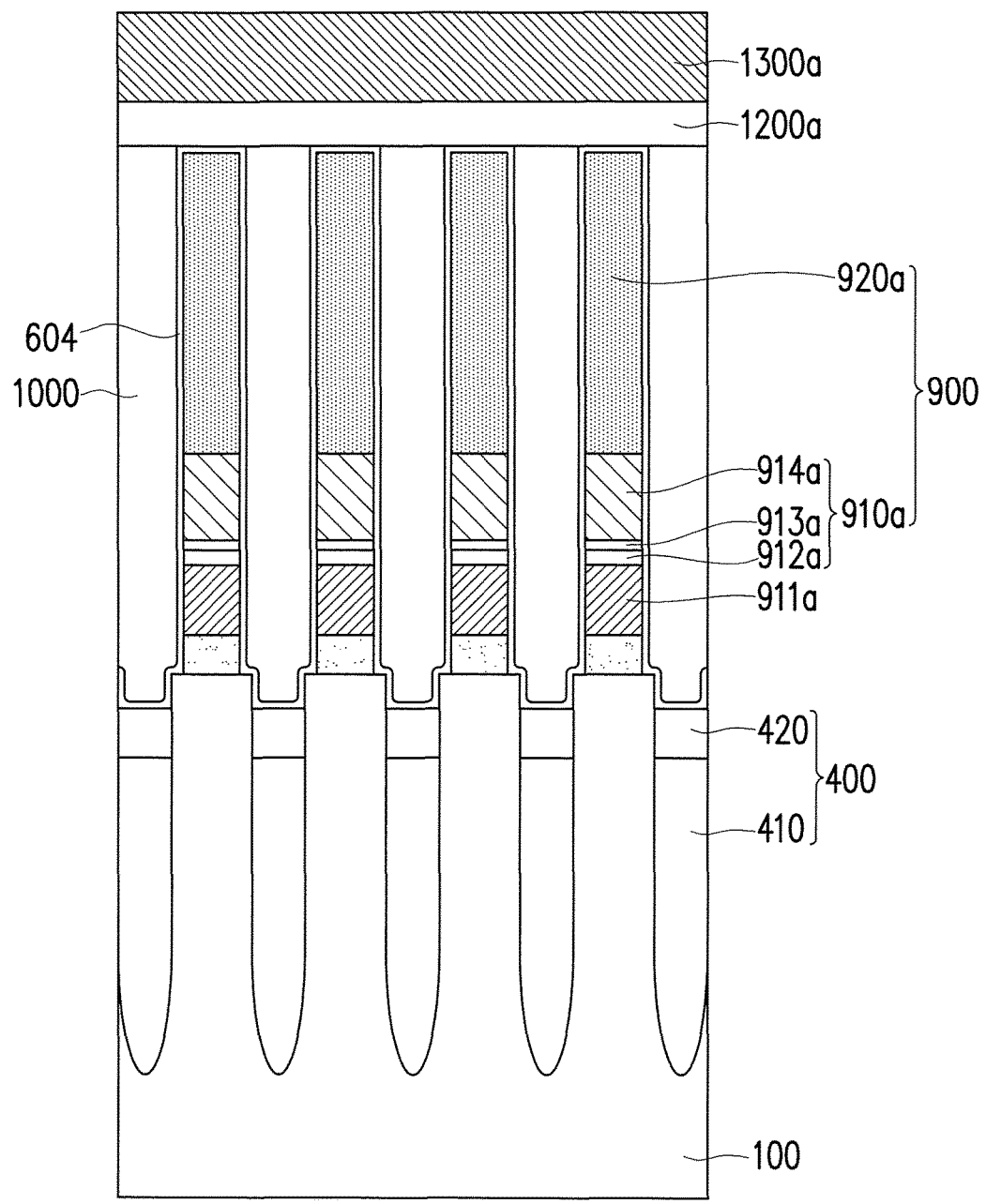
Figure 11D:
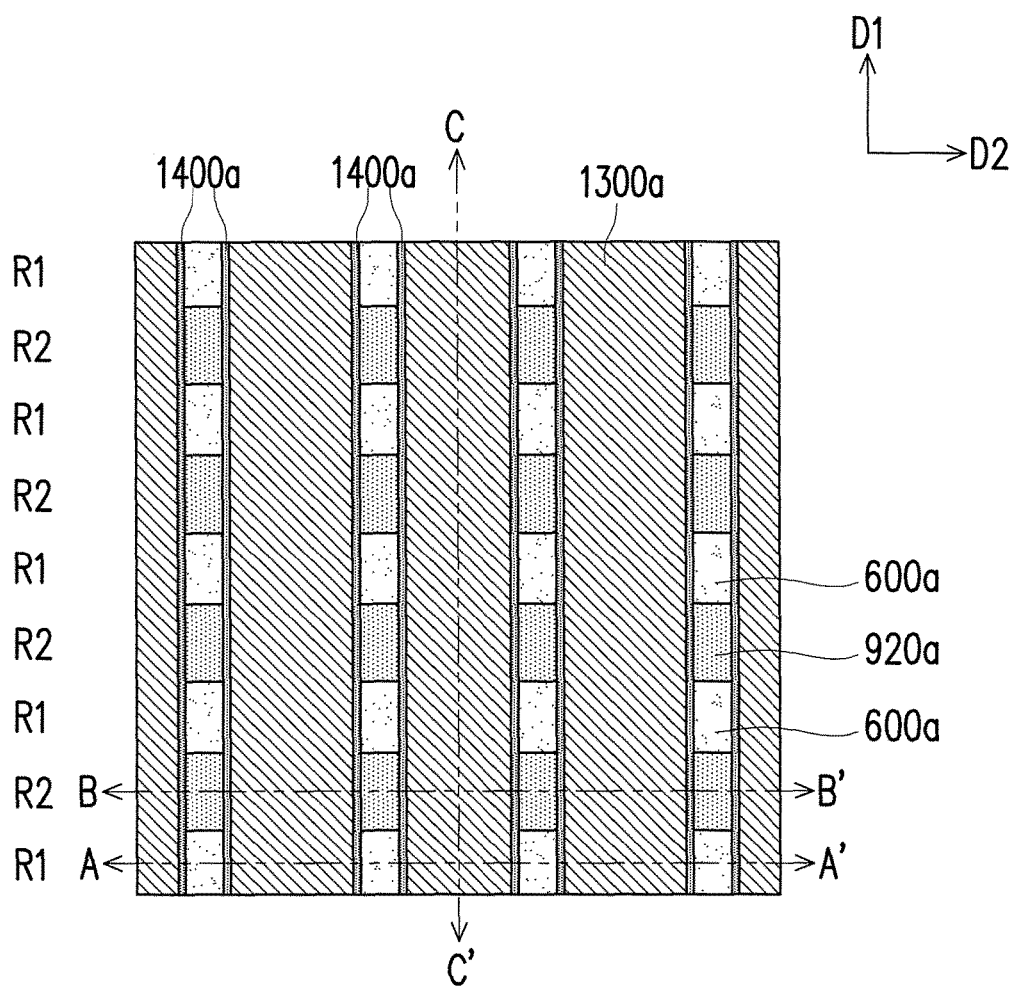
Figure 12A:
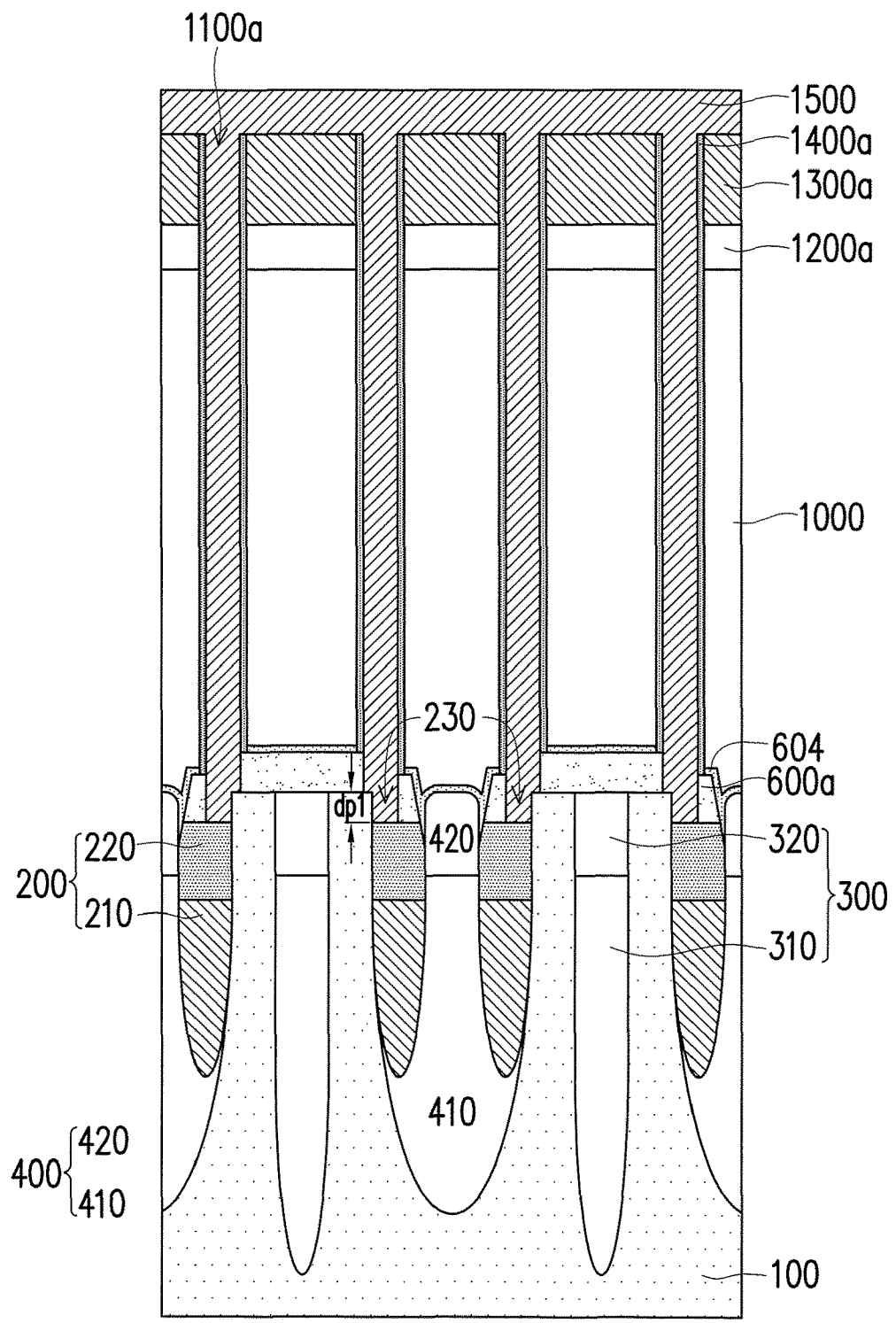
Figure 12B:
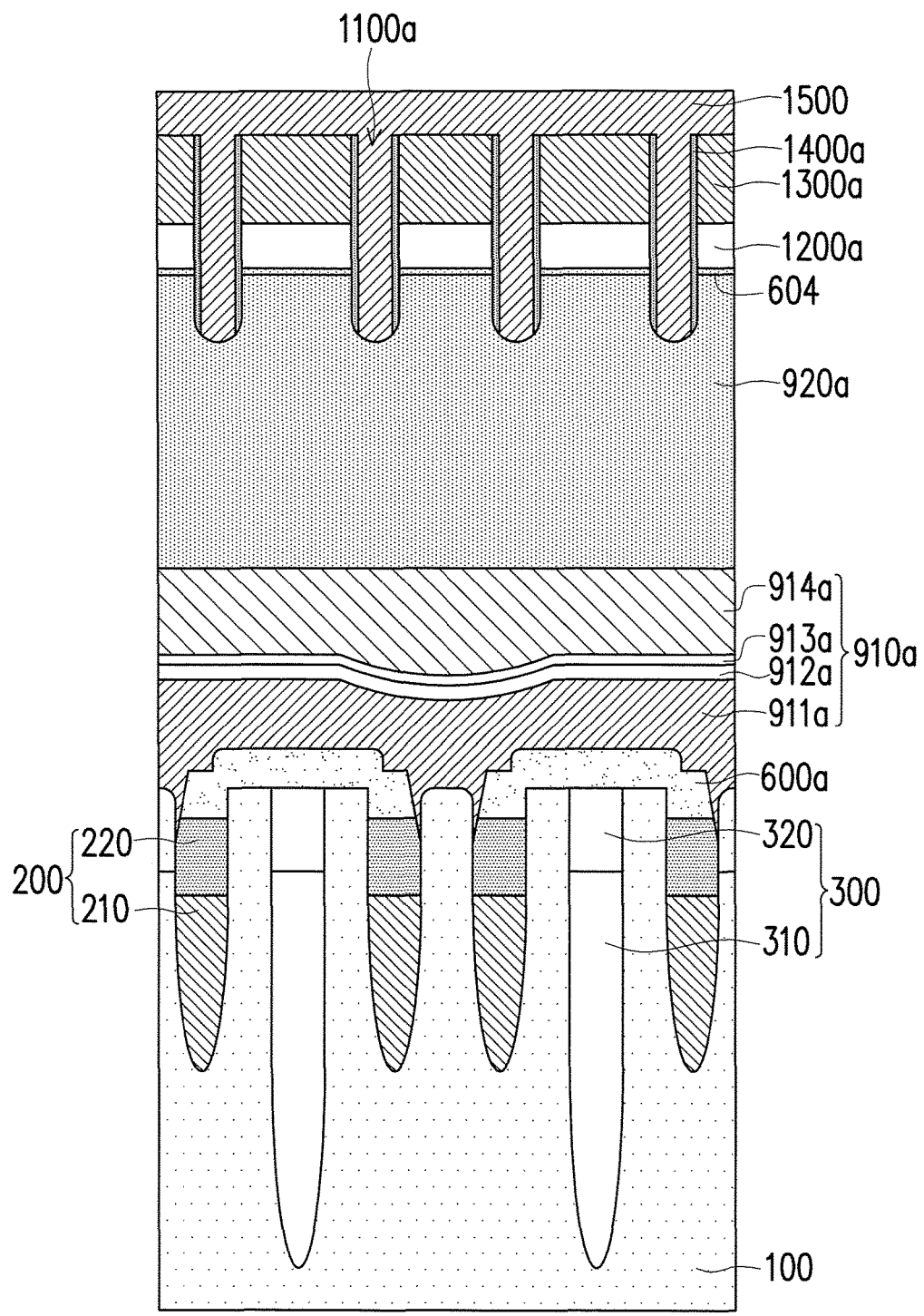
Figure 12C:
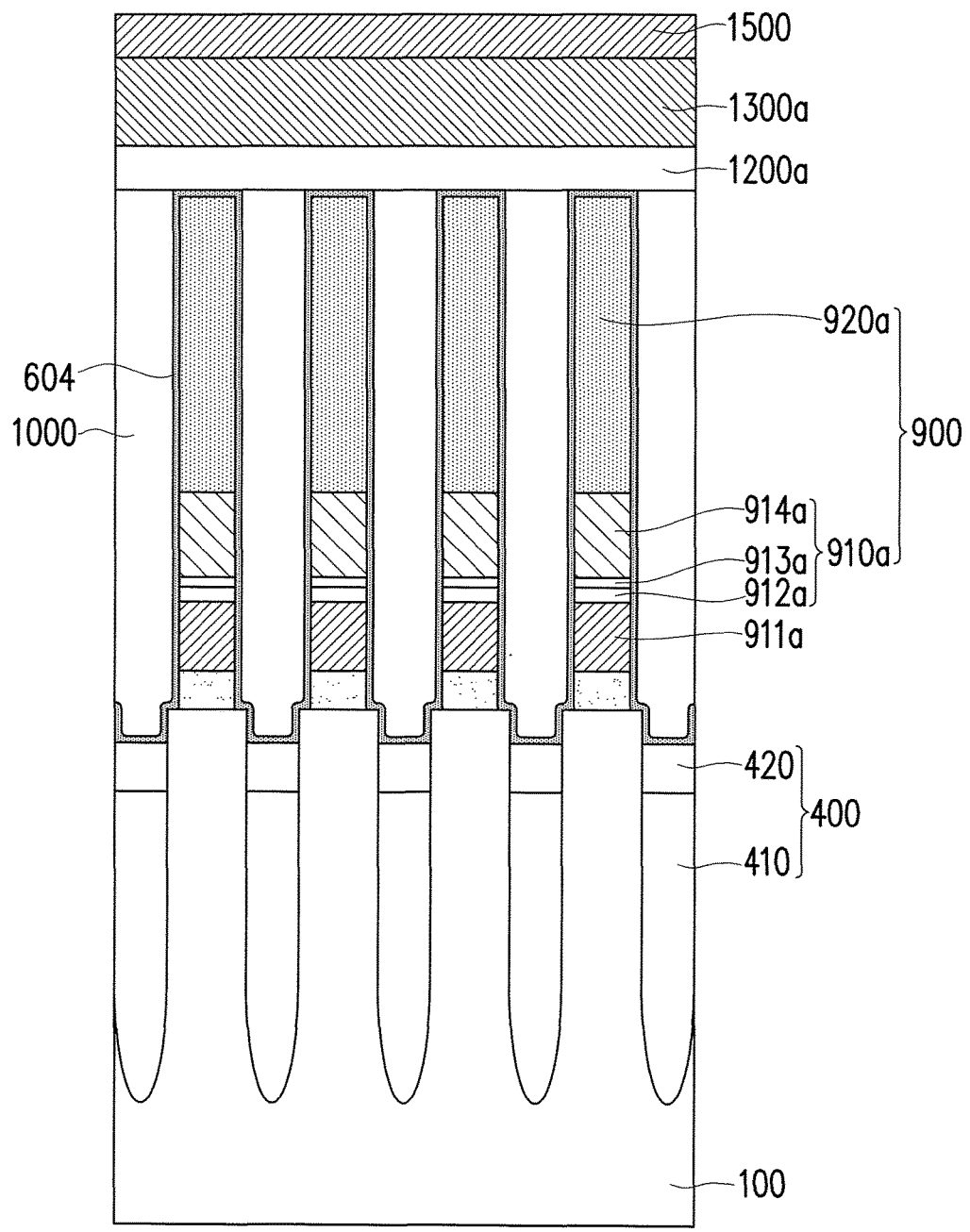
Figure 12D:
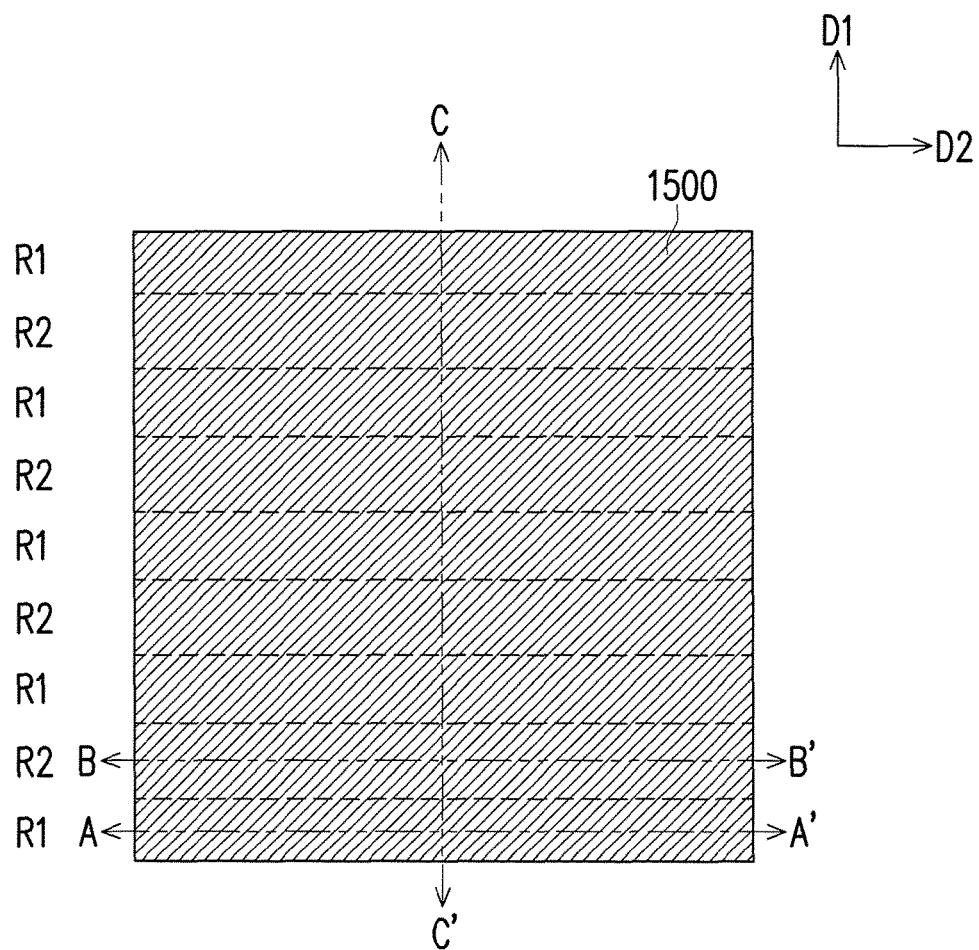
Figure 13A:
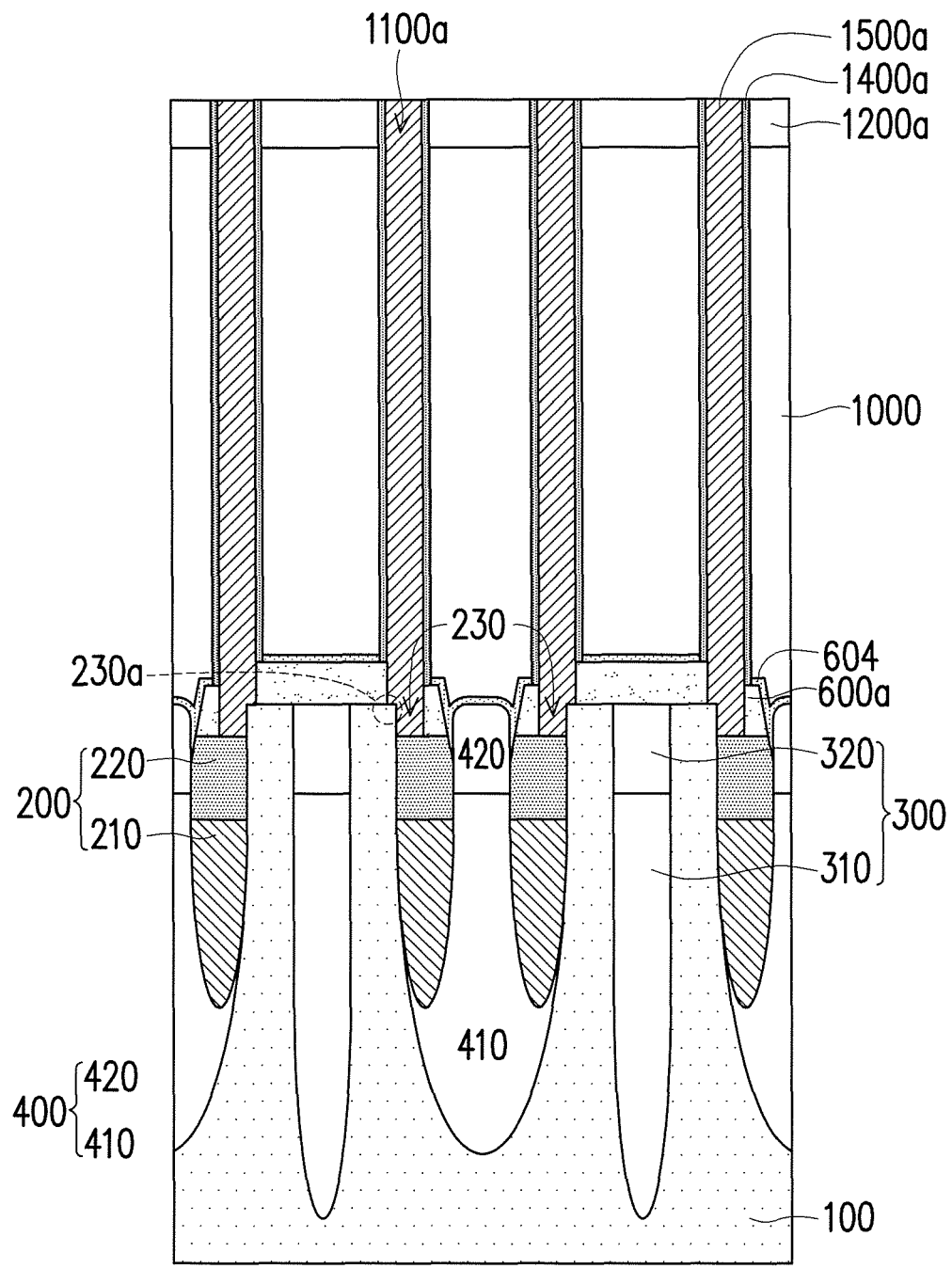
Figure 13B:
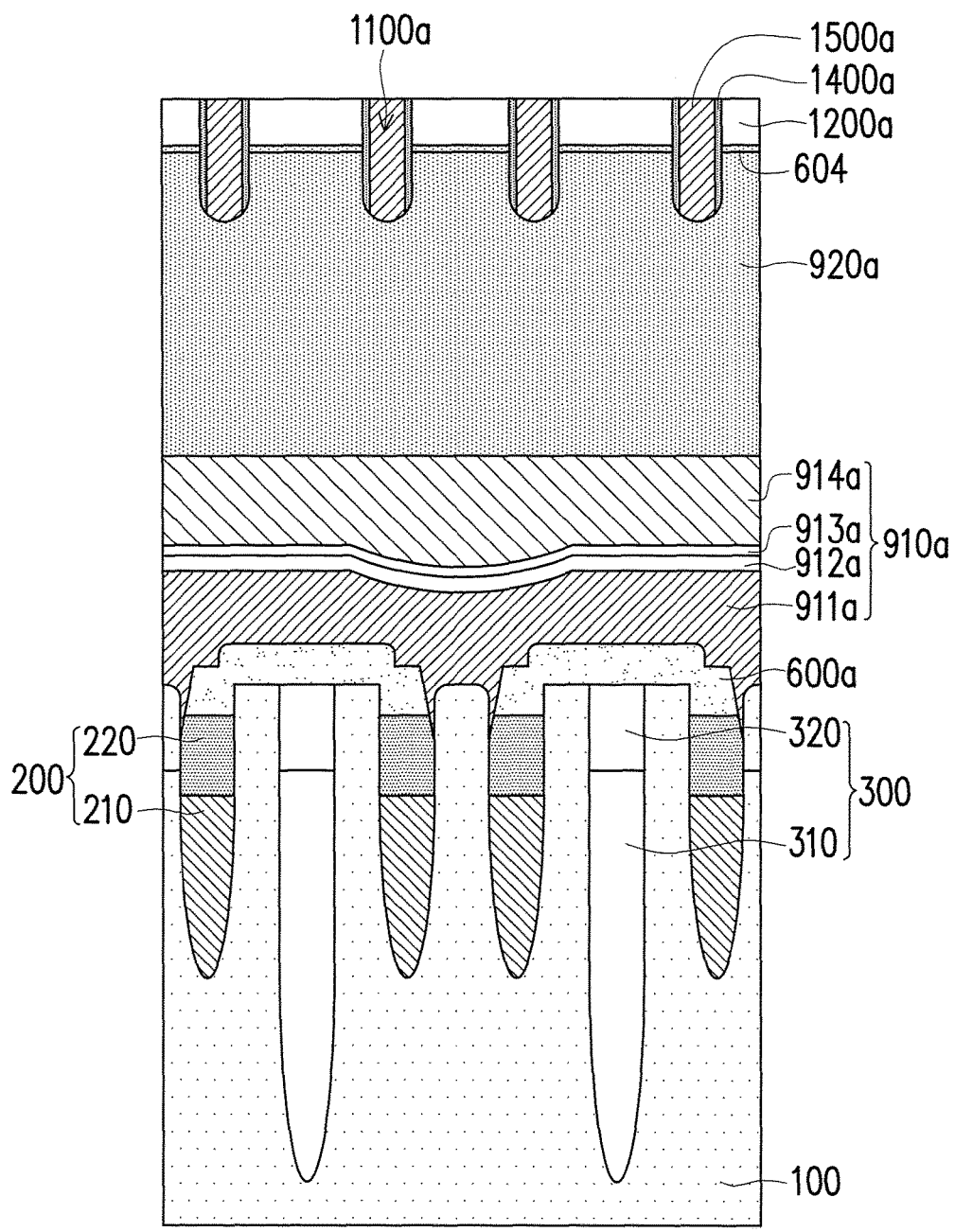
Figure 13C:
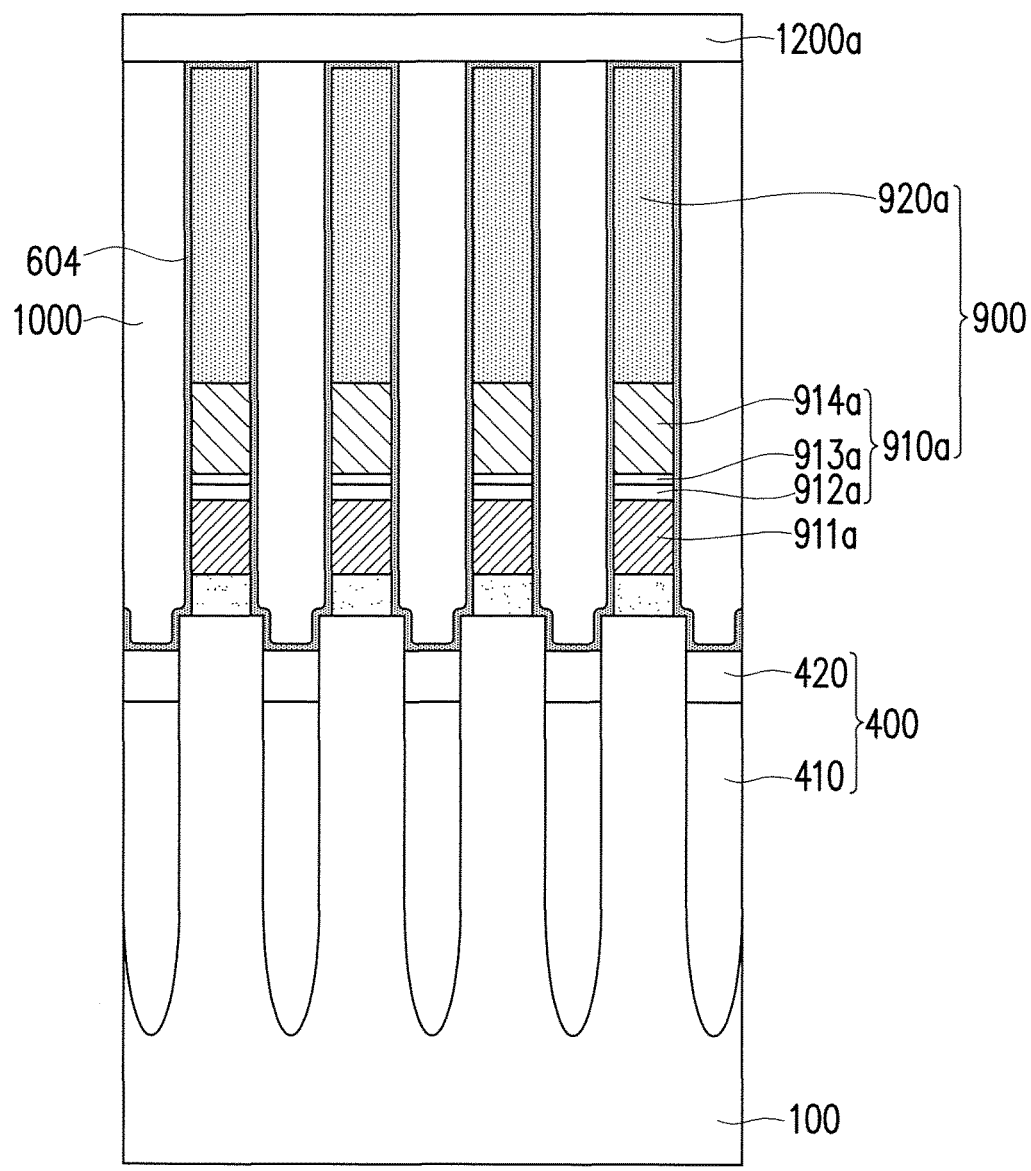
Figure 13D:
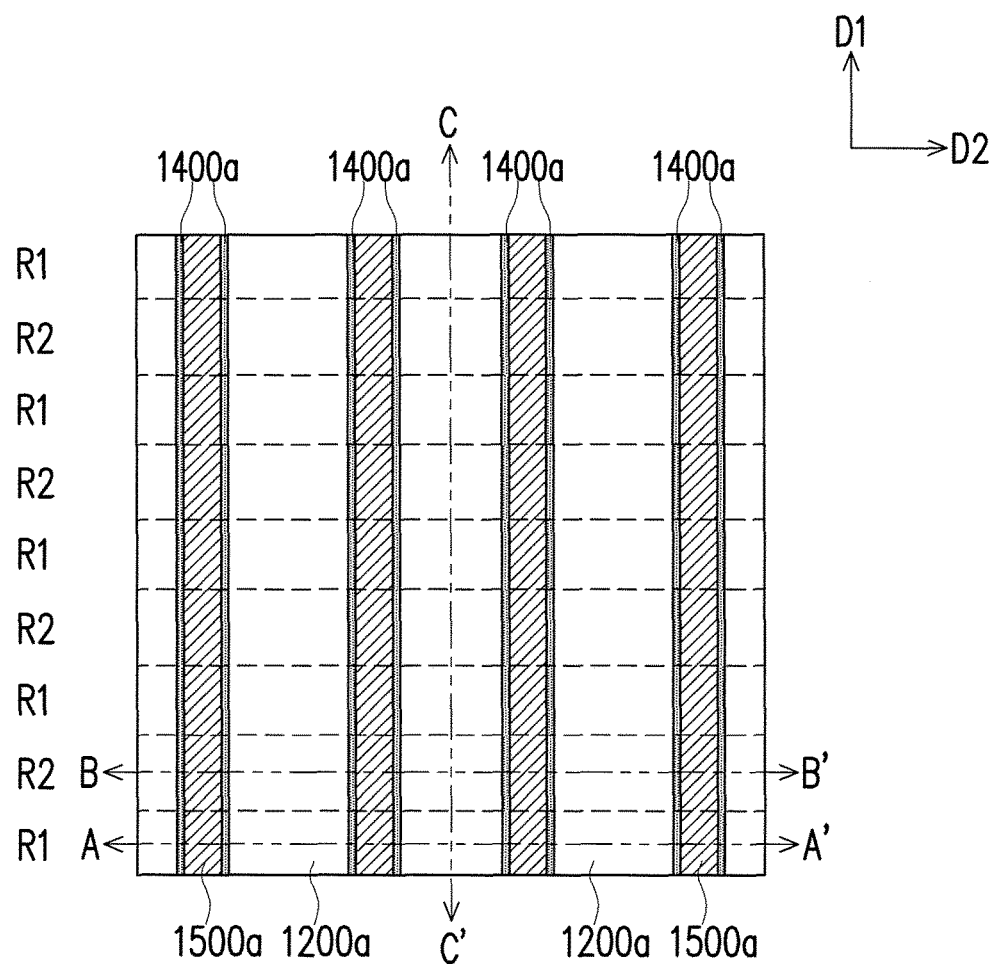

Regarding the embodiments of the manufacturing method of the memory device of the invention, please refer first to FIG. 1D, in which a substrate 100 is provided. The substrate 100 has a plurality of first regions R1 and a plurality of second regions R2. The first regions R1 and the second regions R2 are arranged in a staggered manner along a first direction D1. In some embodiments, the substrate 100 is a semiconductor material, such as silicon or other suitable materials. In some embodiments, the substrate 100 is a silicon-on-insulating layer substrate. In some embodiments, the substrate 100 can be a suitable compound semiconductor, such as gallium nitride, gallium arsenide, or indium phosphide. In some embodiments, the substrate 100 can be a suitable alloy semiconductor, such as silicon germanium, silicon tin, aluminum gallium arsenide, or gallium arsenide phosphide.

Referring to FIG. 1A to FIG. 1D, a plurality of first isolation structures 300 and a plurality of second isolation structures 400 are formed in the substrate 100. The first isolation structures 300 are embedded in the substrate 100 and extended along the first direction D1. The second isolation structures 400 are embedded in the substrate 100 of the first regions R1 between two adjacent first isolation structures 300. The first isolation structures 300 and the second isolation structures 400 can respectively be single layers, bilayers, or multi-layers. In an embodiment in which the first isolation structures 300 and the second isolation structures 400 are bilayers or multi-layers, the first isolation structures 300 and the second isolation structures 400 can be formed using the same or different methods as needed, such that each layer of the isolation structure aimed has the desired characteristics. In some embodiments, the first isolation structures 300 include an oxide layer 310 and a high-density oxide layer 320 located on the oxide layer 310; and the second isolation structures 400 can include an oxide layer 410 and a high-density oxide layer 420 located on the oxide layer 410. The material of the oxide layers 310 and 410 and the high-density oxide layers 320 and 420 is, for instance, silicon oxide. In some embodiments, the first isolation structures 300 and the second isolation structures 400 can be formed by shallow trench isolation. More specifically, a trench can be first formed in the substrate 100, and then an oxide layer and a high-density oxide layer are filled in the trench. In some embodiments, the method of forming the oxide layers 310 and 410 includes, for instance, filling an oxide layer in a trench using plasma-enhanced chemical vapor deposition; and the method of forming the high-density oxide layers 320 and 420 includes, for instance, forming a high-density oxide layer on the oxide layers 310 and 410 using high-density plasma chemical vapor deposition.

Next, an etch-stop material layer 500 is formed on the substrate 100. In some embodiments, the etch-stop material layer 500 is a strip extended along the first direction D1 and covering the first isolation structures 300 and the surface of a portion of the substrate 100 at two sides thereof and covering a portion of the second isolation structures 400 between two adjacent first isolation structures 300 and the surface of a portion of the substrate 100. The material of the etch-stop material layer 500 is, for instance, silicon oxide, the forming method thereof includes, for instance, chemical vapor deposition, and the thickness thereof is, for instance, between 14 nm and 24 nm.

A conductive layer 210 is formed in each of the substrates 100 not covered by the etch-stop material layer 500, and each of the conductive layers 210 is located at two sides of the first isolation structures 300 and extended along the first direction D1 and pass through the second isolation structures 400. The forming method of the conductive layer 210 includes, for instance, forming a trench (not shown) extended along the first direction D1 in the substrate 100 and then forming a conductive material layer in the trench. The conductive material layer covers the surface of the substrate 100 and is filled in the trench. The material of the conductive material layer includes metal, metal silicide, or a combination thereof. The material of the conductive material layer is, for instance, tungsten or other suitable materials. Next, chemical mechanical polishing and/or etch-back is performed to remove a portion of the conductive material layer on the substrate 100 and a portion of the conductive material layer in the trench to form the conductive layer 210 in the trench. The upper surface of the conductive layer 210 is lower than the surface of the substrate 100.

Next, a cap material layer 220a is formed on the substrate 100. The cap material layer 220a covers the etch-stop material layer 500 and covers the conductive layer 210. The material of the cap material layer 220a includes a dielectric material.

The material of the cap material layer 220a is different from the material of the first isolation structures 300 and different from the material of the second isolation structures 400. In the embodiment in which the material of the first isolation structures 300 is silicon oxide, the material of the cap material layer 220a is, for instance, silicon nitride, silicon oxynitride, or other suitable materials. The forming method of the cap material layer 220a includes, for instance, chemical vapor deposition.

Referring further to FIG. 2A to FIG. 2D, a portion of the cap material layer 220a is removed to leave the cap layer 220 in the trench. The upper surface of the cap layer 220 is lower than the surface of the substrate 100 to form a groove 230. A depth dp1 (height difference of the upper surface of the substrate 100 and the upper surface of the cap layer 220) of the groove 230 is, for instance, between 5 nm and 15 nm. In some embodiments, the method of removing a portion of the cap material layer 220a includes, for instance, performing a chemical mechanical polishing process first by using the etch-stop material layer 500 as a stop layer, and then performing an etch-back process to remove the cap material layer 220a. In some other embodiments, the method of removing a portion of the cap material layer 220a includes, for instance, performing an etch-back process by using the etch-stop material layer 500 as the stop layer to remove the cap material layer 220a.

At this point, the first wires 200 are complete. The first wires 200 include a conductive layer 210 and a cap layer 220 located above the conductive layer 210. The first wires 200 are respectively located at two sides of the first isolation structures 300 and extended along the first direction D1 and pass through the second isolation structures 400. In some embodiments, the first wires 200 act as, for instance, word lines.

Referring to FIG. 3A to FIG. 3D, another etch-stop material layer is formed on the substrate 100, and the etch-stop material layer forms an etch-stop material layer 600 with the etch-stop material layer 500. The material of the other etch-stop material layer can be the same as or different from the material of the etch-stop material layer 500, but is different from the material of the cap layer 220. The &Inning method of the other etch-stop material layer includes, for instance, performing a chemical vapor deposition process by using tetraethyl orthosilicate as the gas source. The material of the etch-stop layer 600 is, for instance, silicon oxide or other suitable materials, or a combination thereof. The etch-stop material layer 600 is filled in the groove 230 and covers the substrate 100, the first wires 200, the first isolation structures 300, and the second isolation structures 400. The thickness of the etch-stop material layer 600 in the groove 230 is, for instance, between 5 nm and 15 nm, and the thickness thereof on the substrate 100 is, for instance, between 11 nm and 21 nm.

Referring to FIG. 4A to FIG. 4D, next, the etch-stop material layer 600 is patterned to form a first etch-stop layer 600a. The first etch-stop layer 600a is extended along the first direction D1. A gap 602 between two adjacent first etch-stop layers 600a exposes the high-density oxide layer 420 (the second isolation structures 400) between adjacent first wires 200 and the substrate 100. The method of patterning the etch-stop material layer 600 includes, for instance, a lithography and etching process. The etching process can adopt anisotropic etching, such as plasma etching. When a portion of the etch-stop material layer 600 is removed, a portion of the cap layer 220, the substrate 100, and the second isolation structures 400 may also be removed at the same time, and therefore the gap 602 also exposes a portion of the cap layer 220 (the first isolation structures 200).

Referring to FIG. 5A to FIG. 5D, a conductive layer 910 is formed on the substrate 100 and a cap layer 920 covering the conductive layer 910 is formed. The conductive layer 910 covers the high-density oxide layer 420 (the second isolation structures 400), the cap layer 220 (the first isolation structures 200), and the substrate 100 exposed by the gap 602. The conductive layer 910 can be formed by a single conductive material layer; or the conductive layer 910 can be formed by a plurality of conductive material layers. In the present embodiment, the conductive layer 910 can be integrated with the processes of the transistors of other regions. For instance, the conductive layer 910 can be formed by a conductive layer 911, a conductive layer 912, a conductive layer 913, and a conductive layer 914, wherein the material of the conductive layer 911 is titanium, the material of the conductive layer 912 is titanium nitride, the material of the conductive layer 913 is tungsten silicide, and the material of the conductive layer 914 is tungsten, but the invention is not limited thereto, and other suitable conductive materials can also be used. The conductive layer 910 can be formed by physical vapor deposition or chemical vapor deposition. In some embodiments, the material of the cap layer 920 is different from the material of the stop material layer 600. The material of the cap layer 920 is, for instance, silicon nitride or silicon oxynitride, and the forming method includes, for instance, chemical vapor deposition.

Referring to FIG. 6A to FIG. 6D, the cap layer 920 and the conductive layer 910 are patterned to form a plurality of second wires 900. In some embodiments, the second wires 900 are, for instance, bit lines. The second wires 900 are extended along a second direction D2 and cover the first etch-stop layer 600a on the second regions R2, the cap layer 220 (the first isolation structures 200), and the substrate 100, wherein the second direction D2 is different from the first direction D1. In some embodiments, the second direction D2 and the first direction D1 are perpendicular to each other. A gap 902 between two adjacent second wires 900 exposes the first etch-stop layer 600a on the first regions R1, the high-density oxide layer 420 (the second isolation structures 400), the cap layer 220, and the substrate 100. The patterning of the cap layer 920 and the conductive layer 910 can be performed by a lithography and etching process. The etching process is, for instance, an anisotropic etching process. In some embodiments, the second wires 900 include a cap layer 920a and a conductive layer 910a, wherein the conductive layer 910a includes a conductive layer 911a, a conductive layer 912a, a conductive layer 913a, and a conductive layer 914a. In some other embodiments, when the cap layer 920 and the conductive layer 910 are patterned, and in addition to forming the second wires 900, a gate structure (not shown) is formed in another region of the substrate 100 at the same time. The gate structure includes a gate and a cap layer. The gate of the gate structure is formed by patterning the conductive layer 911, the conductive layer 912, the conductive layer 913, and the conductive layer 914. The cap layer of the gate structure is located on the gate and formed by patterning the cap layer 920.

Referring to FIG. 7A to FIG. 7D, a second etch-stop layer 604 is formed on the substrate 100, the cap layer 220, the high-density oxide layer 420 (the second isolation structures 400), the cap layer 920a, and the first etch-stop layer 600a. The second etch-stop layer 604 further covers the sidewall of the second wires 900. Next, a dielectric layer 1000 is formed on the etch-stop layer 604. The dielectric layer 1000 covers the first regions R1 and is filled in the gaps 902 between the second wires 900. The material of the second etch-stop layer 604 is different from the material of the dielectric layer 1000 and different from the material of the first etch-stop layer 600a. The material of the second etch-stop layer 604 is, for instance, silicon nitride or silicon oxynitride, and the forming method includes, for instance, chemical vapor deposition. The material of the dielectric layer 1000 is, for instance, silicon oxide, spin-on-glass, other suitable materials, or a combination thereof The method of forming the dielectric layer 1000 includes, for instance, chemical vapor deposition or spin coating. After the dielectric layer 1000 is formed, a chemical-mechanical polishing process can further be performed by using the second etch-stop layer 604 as a stop layer such that the dielectric layer 100 has a flat surface. In some embodiments, the upper surface of the dielectric layer 1000 and the upper surface of the second etch-stop layer 604 on the second wires 900 are coplanar, but the invention is not limited thereto.

Referring to FIG. 8A to FIG. 8D, an intermediate layer 1200 and a hard mask layer 1300 are formed on the dielectric layer 1000. In some embodiments, the material of the intermediate layer 1200 is different from the material of the dielectric layer 1000. For instance, the material of the intermediate layer 1200 is silicon oxide or other suitable materials, and the forming method includes, for instance, chemical vapor deposition. The material of the hard mask layer 1300 is, for instance, polysilicon or other suitable materials, and the forming method includes, for instance, chemical vapor deposition.

Referring to FIG. 9A to FIG. 9D, the hard mask layer 1300 and the intermediate layer 1200 are patterned to form a patterned hard mask layer 1300a and a patterned intermediate layer 1200a. The patterned hard mask layer 1300a and the patterned intermediate layer 1200a are, for instance, strips extended along the first direction D1. Next, anisotropic etching is performed on the dielectric layer 1000 by using the patterned intermediate layer 1200a and the patterned hard mask layer 1300a as a mask to form a plurality of openings 1100. In the first regions R1, the bottom of the openings 1100 exposes the first etch-stop layer 600a. Moreover, in some embodiments, since the gap between two adjacent patterned hard mask layers 1300a is, for instance, extended along the first direction D1 and disposed across the trench of the first regions R1 and the second regions R2, in the second regions R2, the bottom of the openings 1100 exposes the cap layer 920a.

The anisotropic etching process performed on the dielectric layer 1000 can be a multi-stage etching process. In some embodiments, the first stage of the etching process is performed, the second etch-stop layer 604 is used as an etch-stop layer, and an etchant having good etch selectivity between the dielectric layer 1000 and the second etch-stop layer 604 and high etch selectivity between the dielectric layer 1000 and the cap layer 920a is selected to remove the dielectric layer 1000 exposed by the patterned hard mask layer 1300a. A second stage of the etching process is performed to remove the second etch-stop layer 604 exposed by the patterned hard mask layer 1300a so as to form the openings 1100. When the second stage of the etching process is performed, in the first regions R1, the material of the first etch-stop layer 600a is different from the material of the second etch-stop layer 604, and an etchant having high etch selectivity between the second etch-stop layer 604 and the first etch-stop layer 600a is selected, and therefore the first etch-stop layer 600a can be used as an etch-stop layer when the second etch-stop layer 604 is etched to prevent the cap layer 220 below from being etched or etched through. In other words, after the second stage of the etching process is performed, in the first regions R1, the bottom of the openings 1100 exposes the first etch-stop layer 600a and does not expose the cap layer 220 or the conductive layer 210 below the cap layer 220. Moreover, in some embodiments, when the second stage of the etching process is performed, when the selected etchant does not have sufficient etch selectivity between the second etch-stop layer 604 and the cap layer 920a, the portion of the cap layer 920a not covered by the patterned hard mask layer 1300a in the second regions R2 is also etched. Since the thickness of the second etch-stop layer 604 etched is relatively small and is much smaller than that of the cap layer 920a, only a little of the cap layer 920a of the second regions R2 is etched and the cap layer 920a is not etched through, and therefore the depth of the openings 1100 of the first regions R1 is greater; and the depth of the openings 1100 of the second regions R2 is less.

Referring to FIG. 10A to FIG. 10D, a protective layer 1400 is formed above the substrate 100. The protective layer 1400 covers the bottom and the sidewall of the openings 1100 and the patterned hard mask layer 1300a. The material of the protective layer 1400 is different from the material of the dielectric layer 1000 and different from the material of the first etch-stop layer 600a. The material of the protective layer 1400 is, for instance, silicon nitride, silicon oxynitride, or other suitable materials. The method of forming the protective layer 1400 includes, for instance, chemical vapor deposition. The thickness of the protective layer 1400 is, for instance, between 3 nm and 10 nm.

Referring to FIG. 11A to FIG. 11D, an anisotropic etching process is performed on the protective layer 1400 to form a protective layer 1400a on the sidewall of the openings 1100. If the position of the openings 1100 formed is shifted or the size of the openings 1100 is too large, then when the material of the material layer (such as the high-density oxide layer 420) exposed by the bottom or the sidewall of the openings 1100 is the same as the material of the first etch-stop layer 600a to be subsequently removed or the etch characteristics of the two are similar, the protective layer 1400a can cover the sidewall of the openings 1100 and a portion of the bottom surface of the openings 1100 to provide sufficient protection in a subsequent etching process.

Referring to FIG. 11A to FIG. 11D and FIG. 12A to FIG. 12D, the first etch-stop layer 600a exposed by the bottom of the openings 1100 is removed to form a plurality of via openings 1100a. The via openings 1100a expose the upper surface of the substrate 100 and the substrate 100 exposed by the sidewall of a portion of the groove 230. The method of removing the first etch-stop layer 600a exposed by the bottom of the openings 1100 includes, for instance, performing a selective etching process. In the invention, since the material of the first etch-stop layer 600a is different from the material of the cap layer 220, sufficient etch selectivity exists between the first etch-stop layer 600a and the cap layer 220, and therefore the first etch-stop layer 600a can protect the cap layer 220 and the conductive layer 210 below when the via openings 1100a are formed.

Referring further to FIG. 12A to FIG. 12D, a conductive layer 1500 is formed on the patterned hard mask layer 1300a and in the via openings 1100a. The material of the conductive layer 1500 is, for instance, doped polysilicon or metal, and the forming method includes, for instance, chemical vapor deposition or physical vapor deposition.

Referring further to FIG. 13A to FIG. 13D, a chemical-mechanical polishing process is pedal' red by using the patterned intermediate layer 1200a as a stop layer to remove the patterned hard mask layer 1300a and the conductive layer 1500 above the patterned hard mask layer 1300a so as to form a plurality of vias 1500a in the via openings 1100a. The vias 1500a are electrically connected to the substrate 100. After the vias 1500a are formed, a process such as forming a capacitor connected to the vias 1500a is further included, which is not described here.

In the invention, referring to FIG. 2A to FIG. 2D and FIG. 11A to FIG. 11D, a groove 230 is formed on the cap layer 220 of the first wires 200, and then a first etch-stop layer 600a is formed in the groove 230. Since the material of the first etch-stop layer 600a is different from the material of the cap layer 220, when the via openings 1100a are subsequently formed, sufficient etch selectivity exists between the first etch-stop layer 600a and the cap layer 220 to protect the cap layer 220 below from being etched. As a result, even if voids exist in the cap layer, the conductive layer 210 can still be prevented from being exposed via the manufacturing method of the invention, and therefore short circuit to the subsequently formed vias 1500a and the conductive layer 210 can be reduced or prevented.

Moreover, in the invention, referring to FIG. 10A to FIG. 10D and FIG. 11A to FIG. 11D, in the invention, before the first etch-stop layer 600a is removed, a protective layer 1400a covering the bottom and the sidewall of the openings 1100 is first formed. By disposing the protective layer 1400a, the dielectric layer 1000, the cap layer 220, and the conductive layer 210 can further be protected when the via openings 1100a are formed, and therefore process margin is increased.

Referring to FIG. 13A to FIG. 13D, the vias 1500a of the memory device of the invention pass through the dielectric layer 1000 and the etch-stop layer 604. The vias 1500a cover a top corner 230a of the groove 230 and is electrically connected to the substrate 100. In other words, the vias 1500a are electrically connected to the upper surface of the substrate 100 and the sidewall of the substrate 100 exposed by the cap layer 220. The vias 1500a have two bottom surfaces having different heights. More specifically, the height of a bottom surface of the vias 1500a in contact with the cap layer 220 is less; and the height of another bottom surface of the vias 1500a in contact with the upper surface of the substrate 100 is greater. In an embodiment, the height difference of the two bottom surfaces is 5 nm to 15 nm.

It should be mentioned that, in some embodiments, the upper section and the middle section of the sidewall of the vias 1500a are surrounded by the protective layer 1400a, and at least a portion of the lower section of the sidewall of the vias 1500a is covered by the etch-stop layer 600a. Moreover, in some other embodiments, the upper section and the middle section of the sidewall of the vias 1500a are directly surrounded by the dielectric layer 1000, and at least a portion of the lower section of the sidewall of the vias 1500a is directly covered by the etch-stop layer 600a.

Based on the above, in the invention, the cap layer on the first wires is made thinner to form the first etch-stop layer, such that when the via openings are formed, the cap layer and the conductive layer below can be protected. Moreover, before the via openings are formed, a protective layer covering the bottom and the sidewall of the openings is first formed in the openings, and therefore the dielectric layer, the cap layer, and the conductive layer can be further protected to increase process margin.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a memory device, comprising:

providing a substrate, wherein the substrate has a plurality of first regions and a plurality of second regions, and the first regions and the second regions are arranged in a staggered manner along a first direction;

forming a plurality of first wires in the substrate, wherein the first wires are extended along the first direction, and the first wires comprise a conductive layer and a cap layer located on the conductive layer;

removing a portion of the cap layer to form a groove in an upper surface of the cap layer, such that a portion of a sidewall of the substrate is exposed by the groove;

forming an etch-stop layer, wherein the etch-stop layer at least covers the cap layer and is filled in the groove;

forming a dielectric layer, wherein the dielectric layer in the first regions covers the first wires and the substrate;

forming a plurality of openings in the dielectric layer in the first regions, wherein the openings expose an upper surface of the etch-stop layer;

etching the openings to form a plurality of via openings, wherein the via openings expose an upper surface of the substrate and the groove; and forming a plurality of vias, wherein the vias are filled in the via openings and each of the vias is electrically contacted with the portion of the sidewall of the substrate exposed by the groove.

2. The manufacturing method of the memory device of claim 1, wherein a method of forming the etch-stop layer comprises:

forming a first etch-stop layer, wherein the first etch-stop layer at least covers the cap layer and is filled in the groove; and forming a second etch-stop layer, wherein the second etch-stop layer at least covers the first etch-stop layer and the cap layer.

3. The manufacturing method of the memory device of claim 1, further comprising:

forming a plurality of first isolation structures in the substrate before a portion of the cap layer is removed, wherein the first wires are respectively located at two sides of the first isolation structures; and forming a plurality of second isolation structures in the substrate before a portion of the cap layer is removed, wherein the second isolation structures are respectively located in the substrate of the first regions between two adjacent first isolation structures.

4. The manufacturing method of the memory device of claim 1, further comprising forming a plurality of second wires in the second regions after the etch-stop layer is formed, wherein the second wires are extended along a second direction and cover the etch-stop layer and the substrate, and the first direction is different from the second direction.

* * * * *